(12) United States Patent
Wang et al.

(10) Patent No.: US 7,361,412 B2
(45) Date of Patent: Apr. 22, 2008

(54) NANOSTRUCTURED SOLDERED OR BRAZED JOINTS MADE WITH REACTIVE MULTILAYER FOILS

(75) Inventors: Jiaping Wang, Vienna, VA (US); Etienne Besnoin, Baltimore, MD (US); Omar Knio, Timonium, MD (US); Timothy P. Weihs, Baltimore, MD (US)

(73) Assignee: Johns Hopkins University, Baltimore, MD (US)

( * ) Notice: Subject to any disclaimer, the term of this patent is extended or adjusted under 35 U.S.C. 154(b) by 27 days.

(21) Appl. No.: 10/844,816

(22) Filed: May 13, 2004

(65) Prior Publication Data

US 2005/0051607 A1 Mar. 10, 2005

Related U.S. Application Data

(60) Continuation-in-part of application No. 10/761,688, filed on Jan. 21, 2004, now abandoned, which is a division of application No. 09/846,486, filed on May 1, 2001, now Pat. No. 6,736,942.

(60) Provisional application No. 60/475,830, filed on Jun. 4, 2003, provisional application No. 60/469,841, filed on May 13, 2003, provisional application No. 60/201,292, filed on May 2, 2000.

(51) Int. Cl.
| | |
|---|---|
| *B23K 1/00* | (2006.01) |
| *B23K 31/02* | (2006.01) |
| *B32B 5/00* | (2006.01) |
| *B32B 15/01* | (2006.01) |

(52) U.S. Cl. .................. 428/686; 428/220; 428/615; 228/245; 228/249; 228/252

(58) Field of Classification Search ..................... None
See application file for complete search history.

(56) References Cited

U.S. PATENT DOCUMENTS 3,615,277 A 10/1971 Kreider et al.

(Continued)

FOREIGN PATENT DOCUMENTS

| EP | 0381509 | 8/1990 |
|---|---|---|
| GB | 990692 | 4/1965 |

OTHER PUBLICATIONS

Martin, J.I., et al., "Ordered Magnetic Nanostructures: Fabrication and Properties" Journal of Magnetism and Magnetic Materials, vol. 256, pp. 449-501 (2003).

(Continued)

*Primary Examiner*—Keith D. Hendricks
*Assistant Examiner*—Jason L. Savage
(74) *Attorney, Agent, or Firm*—Lowenstein Sandler PC

(57) ABSTRACT

Self-propagating formation reactions in nanostructured multilayer foils provide rapid bursts of heat at room temperature and therefore can act as local heat sources to melt solder or braze layers and join materials. This reactive joining method provides very localized heating to the components and rapid cooling across the joint. The rapid cooling results in a very fine microstructure of the solder or braze material. The scale of the fine microstructure of the solder or braze material is dependant on cooling rate of the reactive joints which varies with geometries and properties of the foils and components. The microstructure of the solder or braze layer of the joints formed by melting solder in a furnace is much coarser due to the slow cooling rate. Reactive joints with finer solder or braze microstructure show higher shear strength compared with those made by conventional furnace joining with much coarser solder or braze microstructure. It is expected that the reactive joints may also have better fatigue properties compared with conventional furnace joints.

3 Claims, 22 Drawing Sheets

U.S. PATENT DOCUMENTS

| | | | |
|---|---|---|---|
| 3,705,373 A | 12/1972 | Cameron | 337/160 |
| 3,710,473 A | 1/1973 | McElwain et al. | |
| 3,729,046 A | 4/1973 | Kennedy et al. | 164/46 |
| 4,186,245 A | 1/1980 | Gilman | |
| 4,454,379 A | 6/1984 | Cleveland et al. | 174/107 |
| 4,778,649 A | 10/1988 | Niino et al. | 419/9 |
| 4,836,982 A | 6/1989 | Brupbacher et al. | 420/129 |
| 4,889,745 A | 12/1989 | Sata | 427/12 |
| 4,909,842 A | 3/1990 | Dunmead et al. | 75/236 |
| 4,990,180 A | 2/1991 | Halverson et al. | 75/239 |
| 5,001,019 A | 3/1991 | Ito et al. | |
| 5,062,025 A | 10/1991 | Verhoeven et al. | 361/509 |
| 5,093,148 A | 3/1992 | Christodoulou et al. | 427/37 |
| 5,217,816 A | 6/1993 | Brupbacher et al. | 428/614 |
| 5,251,803 A | 10/1993 | Kashiba et al. | |
| 5,266,132 A | 11/1993 | Danen et al. | 149/15 |
| 5,381,944 A | 1/1995 | Makowiecki et al. | 228/124 |
| 5,490,911 A | 2/1996 | Makowiecki et al. | 204/192 |
| 5,491,003 A | 2/1996 | Akahira | 427/255 |
| 5,503,703 A | 4/1996 | Dahotre et al. | |
| 5,527,442 A | 6/1996 | Sekhar et al. | 204/243 |
| 5,538,795 A | 7/1996 | Barbee, Jr. et al. | 428/420 |
| 5,606,146 A | 2/1997 | Danen et al. | 149/15 |
| 5,773,748 A | 6/1998 | Makowiecki et al. | 102/205 |
| 5,786,129 A | 7/1998 | Ellis | 430/302 |
| 5,913,256 A | 6/1999 | Lowden et al. | 75/248 |
| 6,203,892 B1 | 3/2001 | Matsumura et al. | 428/212 |
| 6,203,897 B1 | 3/2001 | Koizumi et al. | 428/336 |
| 6,596,101 B2 * | 7/2003 | Weihs et al. | 148/442 |
| 6,863,992 B2 * | 3/2005 | Weihs et al. | 428/607 |
| 6,991,855 B2 * | 1/2006 | Weihs et al. | 428/607 |
| 6,991,856 B2 * | 1/2006 | Weihs et al. | 428/635 |
| 2001/0038029 A1 | 11/2001 | Weihs et al. | |
| 2001/0046597 A1 * | 11/2001 | Weihs et al. | 428/336 |
| 2002/0182436 A1 | 12/2002 | Weihs et al. | |

OTHER PUBLICATIONS

Brankovic, S.R., et al., "Surfactant Mediated Electrochemical Deposition of Ag on Au(111)" Electrochemical and Solid-State Letters, vol. 2, pp. 443-445 (1999).

Kumar, A., et al., "Patterning Self-Assembled Monolayers: Applications in Materials Science" Langmuir, vol. 10, pp. 1498-1511 (1994).

Noguchi, K., et al., "Effect of Cooling Rate on Microstructure and Strength Properties of Tin-Silver-Copper Solder Ball Bonding" Materials Transactions, vol. 42, No. 5, pp. 761-768 (2001).

Kim, K.S., et al., "Effects of Cooling Speed on Microstructure and Tensile Properties of Sn-Ag-Cu Alloys" Materials Science and Engineering, vol. A333, pp. 106-114 (2002).

Tang, J., et al., "Factors Affecting The Lamellar Spacing in Two-Phase TiAl Alloys With Fully Lamellar Microstructures" Materials Research Bulletin, vol. 36, pp. 1737-1742 (2001).

Mei, Z., et al., "Fatigue Lives on 60Sn/40Pb Solder Joints Made With Different Cooling Rates" Electronics Packaging, vol. 114, pp. 104-108 (Jun. 1992).

Miyazawa, Y., et al., "Influences of Aging Treatment on Microstructure and Hardness of Sn-(Ag, Bi, Zn) Eutectic Solder Alloys" Materials Transactions, vol. 42, pp. 776-782 (2001).

Hu, J.N., et al., "Aging Behavior of a Sn-Bi Eutectic Solder at Temperatures Between 233 and 373 K" Materials Transactions, vol. 42, No. 5, pp. 769-775 (2001).

Liu, Y., "Lamellar Spacing and Mechanical Property of Undercooled Ti-45Al-2Cr-2Nb Alloy" Materials Letters, vol. 57, pp. 2262-2266 (2003).

Liu, C.T., et al., "Tensile Properties and Fracture Toughness of TiAl Alloys With Controlled Microstructures" Intermetallics, vol. 4, pp. 429-440 (1996).

Tang, J., et al., "Hall-Petch Relationship in Two-Phase TiAl Alloys With Fully Lamellar Microstructures" Materials Research Bulletin, vol. 37, pp. 1315-1321 (2002).

Sun, Y.Q., "An Extended Dislocation Pile-Up Model For The Yield Strength of Lamellar Microstructures" Philosophical Magazine, vol. 77, No. 4, pp. 1107-1126 (1998).

Choi, C., et al., "Effects Of Microstructural Parameters On The Fatigue Crack Growth of Fully Lamellar γ-TiAl Alloys" Materials Science and Engineering, vol. A329-A331, pp. 545-556 (2002).

Ma, E., et al., "Self-Propagating Explosive Reactions in Al/Ni Multilayer Thin Films" Appl. Phys. Letters, vol. 57, pp. 1262-1264 (Sep. 17, 1990).

Dyer, T.S., et al., "The Combustion Synthesis of Multilayer NiAl Systems" Scripta Metallurgica et Materialia, vol. 30, No. 10, pp. 1281-1286 (1994).

Clevenger, L.A., et al., "Explosive Silicidation in Nickel/Amorphous-Silicon Multilayer Thin Films" J. Appl. Phys., vol. 67, pp. 2894-2897 (Mar. 15, 1990).

Lee, S.B., et al., "A Mechanistic Model For Fatigue Life Prediction of Solder Joints For Electronic Packages" Int. J. Fatigue, vol. 19, No. 1, pp. 85-91 (1997).

Kruger, R., et al., "Hermetic Glass Sealing of AlN Packages For High Temperature Applications" Journal of European Ceramic Society, vol. 19, pp. 1067-1070 (1999).

Swiston, Jr., A.M., et al., "Joining Bulk Metallic Glass Using Reactive Multilayer Foils" Scripta Materialia, vol. 48, pp. 1575-1580 (2003).

Etienne, Besnoin, et al. "Effect of Reactant and Product Melting on Self-Propagating Reactions in Multilayer Foils" Journal of Applied Physics, American Institute of Physics, 2002, 5474-5481, 92-9, New York, NY.

Jayaraman, S., et al., "A Numerical Study of Unsteady Self-Propagating Reactions in Multilayer Foils" Proceedings of the Combustion Institute, 1998, 2459-2467, 27 Elsevier, NL.

Jayaraman, S., et al., "Numerical Predictions of Oscillatory Combustion in Reactive Multilayers" Journal of Applied Physics, 1999, 800-809, 86-2, Institute of Physics, New York, NY.

* cited by examiner

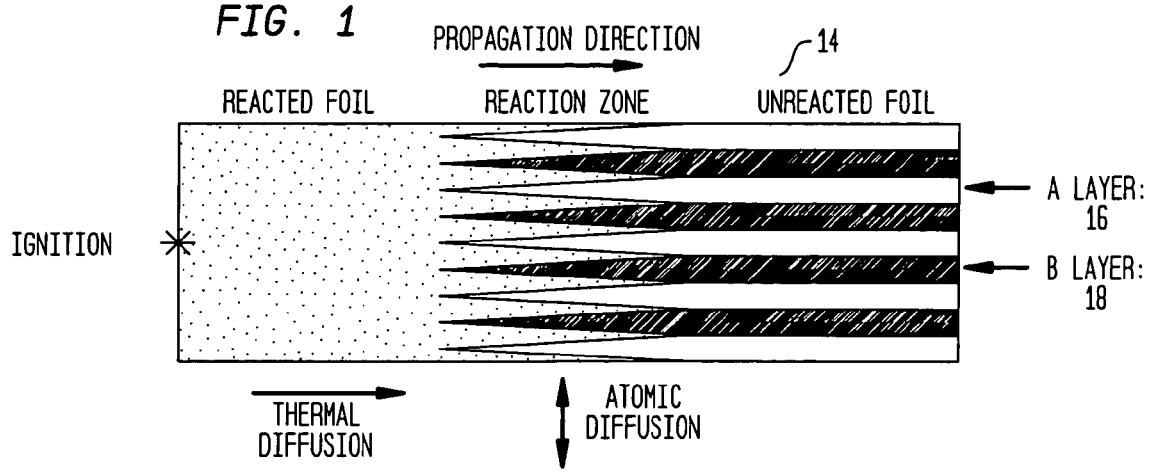
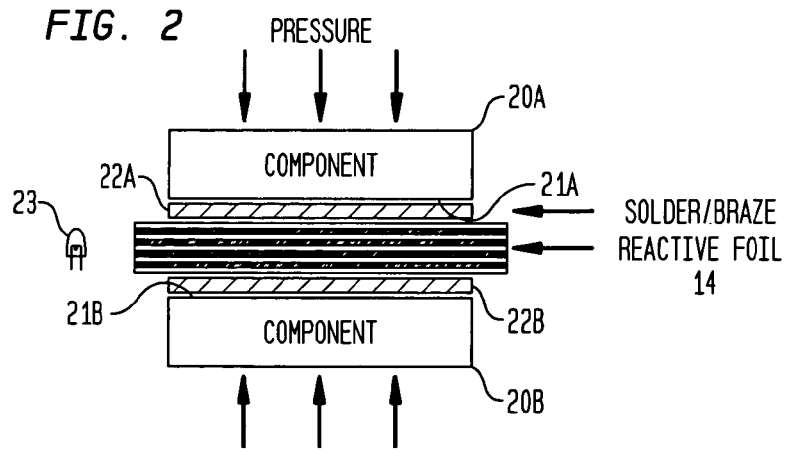
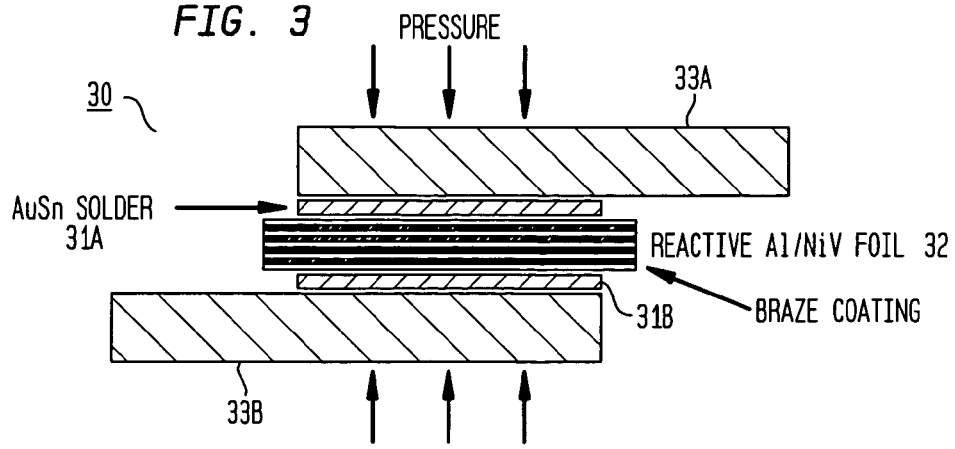

NANOSTRUCTURED SOLDERED OR BRAZED JOINTS MADE WITH REACTIVE MULTILAYER FOILS

CROSS REFERENCE TO RELATED APPLICATIONS

This application claims the benefit of U.S. Provisional Application Ser. No. 60/469,841 filed by Etienne Besnoin et al. on May 13, 2003 (entitled "Method of Controlling Thermal Waves In Reactive Multilayer Joining and Resulting Product") and Ser. No. 60/475,830 filed by Jiaping Wang et al. on Jun. 4, 2003 (entitled "Microstructure of Solder or Braze in Joints Made With Freestanding Reactive Multilayer Foils"), both of which are incorporated herein by reference.

This application is also a continuation-in-part of U.S. patent application Ser. No. 10/761,688 filed by T. Weihs et al. on Jan. 21, 2004 now abandoned (entitled "Freestanding Reactive Multilayer Foils") which is a divisional of U.S. patent application Ser. No. 09/846,486 filed on May 1, 2001, now U.S. Pat. No. 6,736,942 (entitled "Freestanding Reactive Multilayer Foils") which is a non-provisional application that claims the benefit of U.S. Provisional Application Ser. No. 60/201,292 filed by T. Weihs et al. on May 2, 2000 (entitled "Reactive Multilayer Foils"). All of the applications cited in this section are incorporated herein by reference.

GOVERNMENT INTEREST

The United States Government has certain rights in this invention pursuant to Award DMI-0115238 supported by NSF.

BACKGROUND OF THE INVENTION

The joining of components of the same or different materials is fundamental in the manufacture of a wide variety of products ranging from ships and airplanes to tiny semiconductor and optical devices. Joining by brazing or soldering is particularly important in the assembly of products composed of metal parts and the fabrication of electronic and optical devices.

Typically soldered or brazed products are made by sandwiching a braze or solder between mating surfaces of the respective components and heating the sandwiched structure in a furnace or with a torch. Unfortunately these conventional approaches often expose both the components and the joint area to deleterious heat. In brazing or soldering, temperature-sensitive components can be damaged, and thermal damage to the joint may necessitate costly and time consuming anneals. Alternatively, the presence of heat-sensitive components, such as semiconductors devices, may require low temperature joining that produces weaker joints.

Accordingly there is a need for improved methods of joining products by braze or solder and the improved joined products that they can produce.

SUMMARY OF THE INVENTION

The present inventors have determined that the conventional approach of brazing or soldering using furnaces or torches inherently produces sub-optimal joints. The furnace or torch heats not only the joint area but also the bodies to be joined. The heating of these bodies adjacent the joint area, combined with the insulating effect of the bodies, slows the cooling of the braze or solder and produces a joint of enlarged microstructure and weakened mechanical properties.

In accordance with the invention, bodies of materials are joined between mating surfaces by disposing reactive nanostructured foils between the mating surfaces and adjacent one or more layers of braze or solder. The composition and thickness of the foils are chosen, as by thermal modeling techniques, to minimize deleterious heating of the bodies and to provide an optimal heat profile to produce a nanostructured joint having superior mechanical properties.

BRIEF DESCRIPTION OF THE DRAWINGS

The nature, advantages and various additional features of the invention will appear more fully upon consideration of the illustrative embodiments now to be described in detail in connection with the accompanying drawings. In the drawings:

FIG. 1 is a schematic drawing of a self-propagating reaction in a multilayer reactive foil.

FIG. 2 is a schematic diagram illustrating the reactive joining of two components using a reactive foil and a pair of braze or solder layers;

FIG. 3 illustrates the reactive joining of Au-coated stainless steel shear lap specimens;

FIG. 10(a) depicts exemplary measured temperature profiles of the reactive multilayer joining configuration of FIG. 9a;

FIG. 10(b) depicts exemplary predicted temperature profiles of the reactive multilayer joining configuration of FIG. 9a;

Figure 4A:
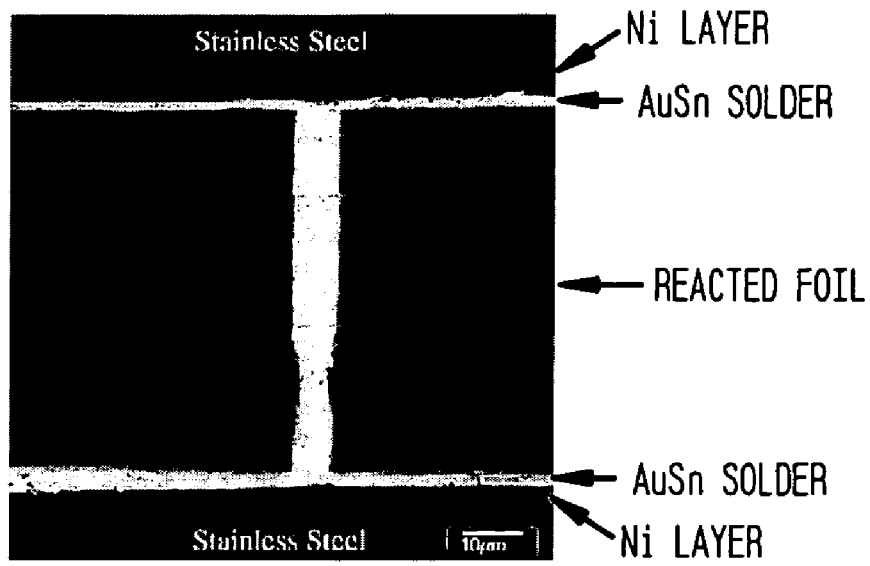
FIGS. 4A and 4B are SEM micrographs of stainless steel components joined using (A) Al/Ni foil and sheets of freestanding AuSn solder and (B) conventional furnace soldering.

It is to be understood that these drawings are for purposes of illustrating the concepts of the invention and, except for the graphs and micrographs, are not to scale.

DETAILED DESCRIPTION

This description is divided into three parts. Part I describes and illustrates reactive foil joining and the resulting joints. Part II describes a thermal modeling technique useful optimizing reactive foil joining, and Part III exemplifies the application of the thermal model to produce superior joints. References indicated by bracketed numbers are fully cited in an attached List.

I. The Method And Resulting Joined Products

A. Multilayer Reactive Foils and Their Use in Forming Joints

Self-propagating exothermic formation reactions have been observed in a variety of nanostructured multilayer foils, such as Al/Ni, Al/Ti, Ni/Si and Nb/Si foils [1-4]. These reactions are driven by a reduction in atomic bond energy. Once the reactions are initiated by a pulse of energy, such as a small spark or a flame, atomic diffusion occurs normal to the layering.

FIG. 1 schematically illustrates a multilayer reactive foil 14 made up of alternating layers 16 and 18 of materials A and B, respectively. These alternating layers 16 and 18 may be any materials amenable to mixing of neighboring atoms (or having changes in chemical bonding) in response to a stimulus. Preferably the pairs A/B of elements are chosen based on the way they react to form stable compounds with large negative heats of formation and high adiabatic reaction temperatures. A wide variety of such combinations is set forth in the above referenced U.S. patent application Ser. No. 09/846,486 which is incorporated herein by reference.

The bond exchange generates heat very rapidly. Thermal diffusion occurs parallel to the layering and heat is conducted down the foil and facilitates more atomic mixing and compound formation, thereby establishing a self-propagating reaction along the foil. The speeds of these self-propagating exothermic reactions are dependent on layer thickness and can rise as high as 30 m/s, with maximum reaction temperatures above 1200° C. [5].

Reactive multilayer foils provide a unique opportunity to dramatically improve conventional soldering and brazing technologies by using the foils as local heat sources to melt solder or braze layers and thereby join components. Reactive foil soldering or brazing can be performed at room temperature and in air, argon or vacuum.

FIG. 2 schematically shows the use of multilayer reactive foil 14 to join together two components 20A and 20B. The reactive foil 14 is sandwiched between the mating surfaces 21A and 21B of the components and adjacent one or more layers 22A, 22B of braze or solder. The reactive foil 14 is preferably a freestanding reactive foil as described in the aforementioned application Ser. No. 09/846,486 but could be a coating on one or more of the components. The braze or solder layers can also be freestanding or coatings on the components.

Once the components, foil and solder or braze are assembled, an ignition stimulus 23 is applied to foil 14 produces rapid and intense heat diffusing as a thermal wavefront through the foil.

This new reactive joining process eliminates the need for furnaces or other external heat sources, and with very localized heating, temperature sensitive components or materials can be joined without thermal damage. The localized heating offered by the reactive foils is also advantageous for joining materials with very different coefficients of thermal expansion, e.g. joining metal and ceramics. Typically when metals are soldered or brazed to ceramics, significant thermal stresses arise on cooling from the high soldering or brazing temperatures, because of the thermal expansion coefficient mismatch between metals and ceramics. These thermal stresses limit the size of the metal/ceramic joint area. When joining with reactive multilayers, the metallic and ceramics components absorb little heat and have a very limited rise in temperature. Only the solder or braze layers and the surfaces of the components are heated substantially. Thus the typical mismatch in thermal contraction between metallic and ceramics components and the resulting delamination are avoided and strong metal/ceramics joints with large areas can be formed by this reactive joining process.

In addition, the reactive joining process is fast and cost-effective, and results in strong and thermally-conductive joints. Substantial commercial advantages can thus be achieved, particularly for assembly of microelectronic devices.

B. Factors Affecting the Microstructure of Joints

There are many different properties to be considered in solder or braze joints, such as mechanical, thermal and electrical properties, depending on the different applications of these joints. Among these, mechanical properties are often the most important in many joining application since joints without any mechanical strength cannot be used in practice. The mechanical properties that are important to the service behavior of solder or braze joints include their strength and resistance to fatigue. Considering the potential use of the reactive joints as load-bearing components, improvement of mechanical properties of the joints becomes an even more important issue. In order to optimize the mechanical properties of the reactive joints, it is essential to study the microstructure of the solder or braze within the joint and to understand how the microstructure might affect the mechanical properties of the joint.

Reactive joining is such a very rapid process that the total heating and cooling is completed within less than one second. With a rapid cooling rate greater than 500° C./second, the microstructures of the solder or braze materials in reactive joints might be very different from those obtained from conventional furnace soldering or brazing. Previous research on reactive joining has not addressed this issue. The present invention describes the very different microstructures of solder or braze materials in reactive foil joints and conventional furnace joints due to different cooling rates in these two processes and relates the microstructures of the solder or braze materials with mechanical properties of these joints.

It has been shown in literature that cooling rate greatly affect the microstructures of materials and mechanical properties are dependent on the microstructures of materials. Since eutectic lamellar microstructures can be observed in conventional solder joints, current research about effects of cooling rates and microstructures on mechanical properties in alloys with lamellar eutectic microstructure will be reviewed in more details.

Effect of cooling rate on eutectic microstructures has been studied in several alloy systems. Sn—Ag—Cu alloy is one of the most commonly used solder materials in electronics industry. Noguchi et al. [6] studied the microstructure of Sn—Ag—Cu solder ball bonding formed at various cooling rates, 200, 100, 60, 50, and 10° C./min. The lamellar spacing becomes smaller at faster cooling rate. In this study, the lamellar spacing, ranges between 400 and 2000 nm. The relationship between the cooling rate, Rc, and lamellar spacing, λ, was experimentally determined as $$\lambda = K/Rc^{1/2}$$

where K is a constant. Kim et al. [7] also studied the microstructures of Sn—Ag—Cu alloy prepared under different cooling rates, 0.012° C./s, 0.43°/s and 8° C./s, showing that the eutectic microstructure was coarsened by decreasing the cooling rate.

Cooling rate has similar effect on eutectic microstructures in other alloys. For example, lamellar spacing in two-phase Ti-48Al alloys was investigated as a function of cooling rate by Tang et al. [8]. It was found that the lamellar spacing is inversely proportional to the cooling rate. As the cooling rate increases from 0.1° C./s to 1° C./s, the lamellar spacing decreases from 2000 nm to 250 nm.

Mei and Morris [9] studied the microstructures of Sn60—Pb40 solder joints which were cooled at different conditions: quenched in ice water, air-cooled to room temperature in about 5 minutes, and furnace-cooled in about 30 minutes. The furnace cooled solder joint has a typical lamellar and colony appearance: the two phases are arranged side by side in long range, differently oriented arrays that form colonies. In the air-cooled solder joint, the colony size seems smaller, and the lamellae become shorter. The quenched solder joint has finer features. Increasing the cooling rate of a 60Sn/40Pb solder joint disturbs the regular formation of a lamellar/colony microstructure, and results in a more fine-grained microstructure.

It has been found that in several solder alloy, such as Sn—Ag—Cu, Sn—Pb, Sn—Ag, Sn—Zn, Sn—Bi alloys, finer eutectic microstructures obtained by increasing the cooling rate result in higher strength and higher hardness [7] [10] [6] [11]. In other eutectic alloys, such as Ti—Al alloy, it was also observed that finer lamellar spacing and smaller colony size result in higher strength and hardness [12] [13] [14] [15]. The relationships between lamellar spacing and colony size and yield strength of the alloy follow the extended Hall-Petch equation for lamellar microstructure [16], $$\sigma_y = \sigma_0 + \frac{K}{\sqrt{\lambda}} \text{ or } \sigma_y = \sigma_0 + \frac{K}{\sqrt{d}}$$

where $\sigma_y$ is the yield stress, $\lambda$ is the lamellar spacing, d is the colony size, and $\sigma_0$ and K are constants.

It has been reported in literature that fatigue properties of materials also depend on microstructures. For example, in 60Sn/40Pb solder alloy [9], increasing the cooling rate of the solder joint results in a finer-grained microstructure, facilitating grain boundary deformation mechanisms and leading to a longer fatigue life. In a TiAl alloy with lamellar microstructures, it has been found that in the coarser colony microstructure (approximate to 1400 μm), the fatigue crack growth threshold ($\Delta K_{th}$) is markedly decreased compared with the finer colony microstructure (90 μm), while the crack growth resistance remains constant. The fine lamellar spacing (0.2-0.7 μm) microstructures result in higher $\Delta K_{th}$ and fatigue crack growth resistance compared to the coarse lamellar spacing (approximate to 5.5 μm) microstructure. It was suggested that this higher fatigue resistance is mainly attributed to the higher number of lamellar interfaces resistant to crack advance, as well as to the higher closure effects. The colony boundaries and the lamellar interfaces play an important role in retarding the advancing crack at room temperature, serving as barriers for the dislocation movement and as sinks for dislocation pile-ups [17].

C. Experiments Relating Microstructure with Joint Properties

The reactive multilayers used in the reactive joining process are nanostructured materials [1-4,7-11] that are typically fabricated by vapor depositing hundreds of nanoscale layers that alternate between elements with large, negative heats of mixing, such as borides (e.g. Ti/B), carbides (e.g. Ti/C), silicides (e.g. Ni/Si and Zr/Si, etc), aluminides (e.g. Ni/Al, Ti/Al and Zr/Al, etc) or others. The solder or braze materials are commercial solder/braze alloys used in soldering/brazing industry, such as AuSn, AgSn, PbSn, Cusil, Incusil or others.

As an example, here reactive Al/Ni multilayer foils and AuSn solder were used. The foils were obtained by magnetron sputtering and the final product of the reaction is the AlNi compound. To enhance wetting of the foils by the AuSn solder during joining, the foils were coated with a 1 μm thick wetting layer of Incuisl ABA braze. Joining of gold-coated stainless steel specimens and Al specimens using Al/Ni foils and AuSn solder will be described in detail below. The heating and cooling rate of the reactive joining process were evaluated using infrared imaging. The microstructure and shear strength of the resulting joints were characterized using scanning electron microscopy (SEM) and tensile shear lap tests.

Referring to FIG. 3 stainless steel joints 30 were fabricated by stacking two sheets of AuSn solder 31A, 31B and one reactive foil 32 between two stainless steel samples 33A, 33B. The dimensions of the stainless steel specimens were 0.5 mm×6 mm×25 mm and were electroplated with Ni and then Au to enhance bonding. The Ni layer serves to promote adhesion to the stainless steel after removal of the native oxide, and the Au coating is designed to prevent surface oxidation and thereby enhance wetting by molten AuSn solder. These stainless steel samples were joined at room temperature in air by igniting the reactive foils under pressure of approximately 100 MPa. The joint area was approximately 5 mm by 6 mm. Au and Ni plated Al (6061) specimens were joined in the same way, with joint area of 3 mm×6 mm. The smaller joint area was used for the Al specimens to avoid deformation or fracture of the Al specimens themselves before the failure of the solder joint, due to the low tensile strength of the Al 6061 alloy.

In order to estimate the cooling rate of reactive joining, temperatures in the stainless steel components during the reactive joining were measured using an infrared camera for the case of a 70 μm Al/Ni foil and 25 μm thick AuSn solder sheets. Before the joining process, the sides of the stainless steel specimens were carefully polished to a 6 μm finish and painted white, to ensure a uniform emissivity. Then the temperatures at the side surfaces of the components were monitored during the reactive joining using the infrared camera with a spatial resolution of 108 μm and a temporal resolution of 0.2 seconds. Based on a series of thermal profiles, it was estimated that the total heating time is less than 0.2 seconds. After the reaction, temperatures in the stainless steel specimens decreased very quickly. In the stainless steel components, at 100 microns from the interface between the solder layer and the stainless steel, the temperature decreased to 60.4° C. and 38.8° C. at 0.2 seconds and 0.8 seconds after reaction respectively. Here the cooling rate is very rapid and is estimated to be >1000° C./second.

For comparison some stainless steel specimens were joined using a furnace to heat the AuSn solder instead of using a reactive foil. In this case, two pieces of stainless steel specimens and one piece of AuSn solder (25 μm thick) were clamped together and heated above the melting temperature of AuSn solder in air. Here the cooling rate is much slower which is about 1° C./second.

Figure 5A:
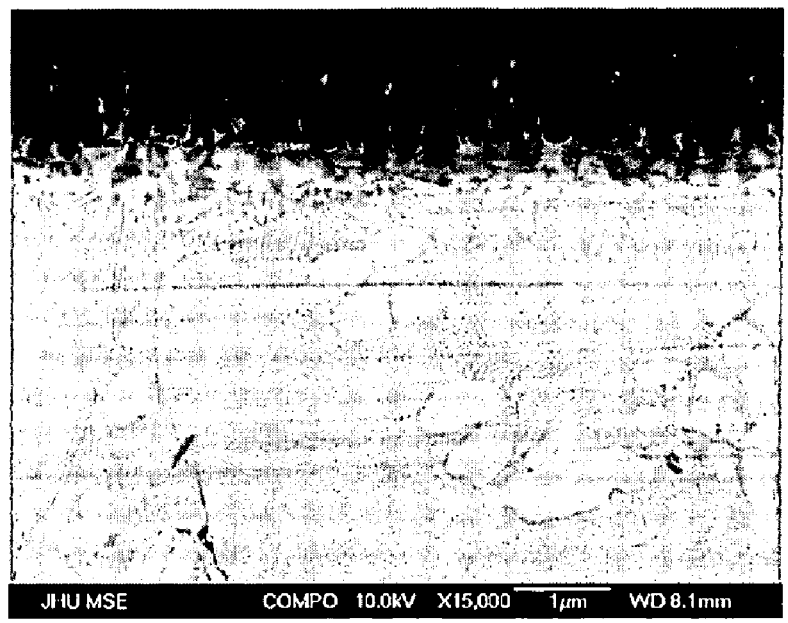
FIGS. 5A and 5B are micrographs depicting microstructures of AuSn solder from (A) reactive foil joining and (B) conventional furnace soldering.

Cross sections of untested stainless steel joints were polished to a 1 μm finish and then characterized using scanning electron microscopy (SEM) in a JEOL microscope. FIG. 4(a) shows two stainless steel specimens that were joined using two pieces of free-standing AuSn solder (25 μm thick) and one Al/Ni reactive foil (80 μm thick). Cracking was observed within the reacted foils and is attributed to the fact that when the foils react they contract due to densification; they also contract due to cooling from the high reaction temperatures. Both sources of contraction can be constrained by the surrounding material, thereby leading to cracking. Molten AuSn solder typically flowed into these cracks, creating a particle composite interface with hard pieces of reactive foil in a solder matrix. Note that the AuSn solder layers decreased in thickness from 25 μm to several microns, suggesting that the majority of the solder flows into cracks and out of the bond area, due to the applied pressure. The microstructure of the AuSn solder layer is shown in FIG. 5(a) at higher magnification. A very fine lamellar eutectic structure is observed, including a light Au rich phase (ξ phase, $Au_5Sn$) and a dark Sn rich phase (δ phase, AuSn). These two phases grow simultaneously and form parallel plates in grain-like colonies. The spacing between these plates is about 50 nm.

Figure 4B:
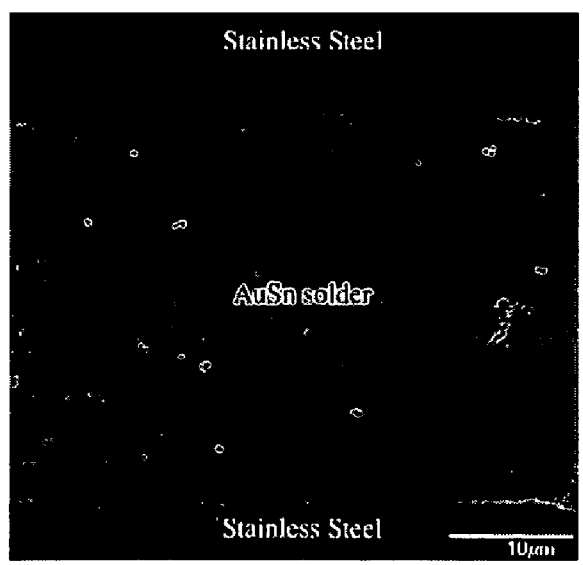
Figure 5B:
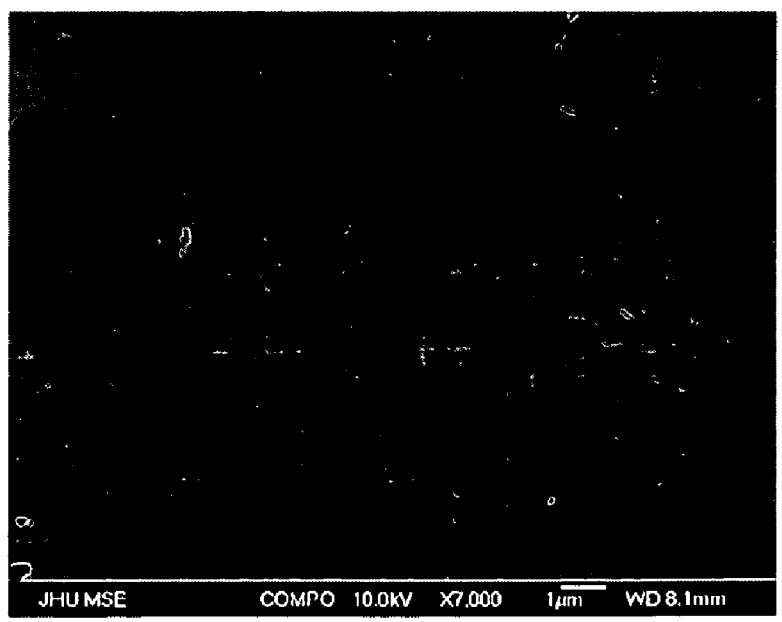

FIG. 4(b) shows two stainless steel specimens that were joined using a piece of free-standing AuSn solder (25 μm thick) heated in furnace. The thickness of the AuSn solder layer remains at 25 μm after soldering compared with several micron AuSn solder left within the joint by reactive joining. The microstructure of the AuSn solder of the joint formed by melting solder in a furnace is much coarser as shown in FIG. 5(b) at higher magnification. This is due to the slow cooling rate in conventional soldering. The lamellar eutectic microstructure has a very high interfacial area per unit volume, and therefore is thermodynamically unstable. The Au-rich phases and Sn-rich phases grow and eventually rearrange themselves into a coarser equiaxed structure.

Study of the microstructure of the AuSn solder layer in reactive joints and conventional furnace solder joint suggests that solder material with a much finer microstructure can be obtained during reactive joining process due to its very rapid cooling rate.

Stainless steel joints made by both reactive joining and conventional furnace soldering were tested in tension at room temperature using an Instron testing machine and a crosshead speed of 0.1 mm/min. Shear strengths of these joints were obtained by dividing the maximum failure load by the joint area. The average shear strength of the stainless steel joints by reactive joining is approximately 48±3 MPa. In comparison, the average shear strength of the stainless steel joints made by conventional soldering was only 38±1 MPa. The lower strengths of these joints can be attributed to their coarser microstructure (FIG. 5(b)), compared to the fine eutectic microstructure (FIG. 5(a)) for reactive multilayer joints that cool very rapidly. It could also be attributed to their thick 25 μm AuSn solder layer (FIG. 4(b)), compared to the several microns thick AuSn solder layer (FIG. 4(a)) in reactive joints. In order to demonstrate that the thickness factor is not important, some stainless steel joints made by reactive joining were annealed at the AuSn solder's melting temperature for 5 minutes. It was found that the average shear strength of these annealed joints decreases to about 39 MPa, similar to the average shear strength of stainless steel joints by conventional furnace soldering. For these joints, the AuSn solder layer is several microns thick with a coarse microstructure. This demonstrated that the lower strengths of these joints by conventional furnace soldering are attributed to their coarser microstructure rather than their thicker solder layer. It is expected that if other solder or braze materials are used, finely microstructured solder or braze materials can also be obtained by reactive joining due to the rapid cooling rate, and therefore, that the shear strength of the reactive joints will be higher than those made by conventional soldering or brazing joints.

Data in literature show that materials with finer microstructure might have higher hardness, strength and better fatigue properties compared with those with much coarser microstructure. It is expected that the reactive joints with much finer microstructured solder or braze layer may also have better fatigue properties compared with conventional furnace joints. This is a very important advantage for the applications of the reactive joining process.

This demonstrated that the very localized heating and very rapid cooling during reactive joining can not only offer the ability to join temperature sensitive materials or dissimilar material but also improve the mechanical properties of the joints by producing very fine microstructure of the solder or braze materials.

Figure 6:
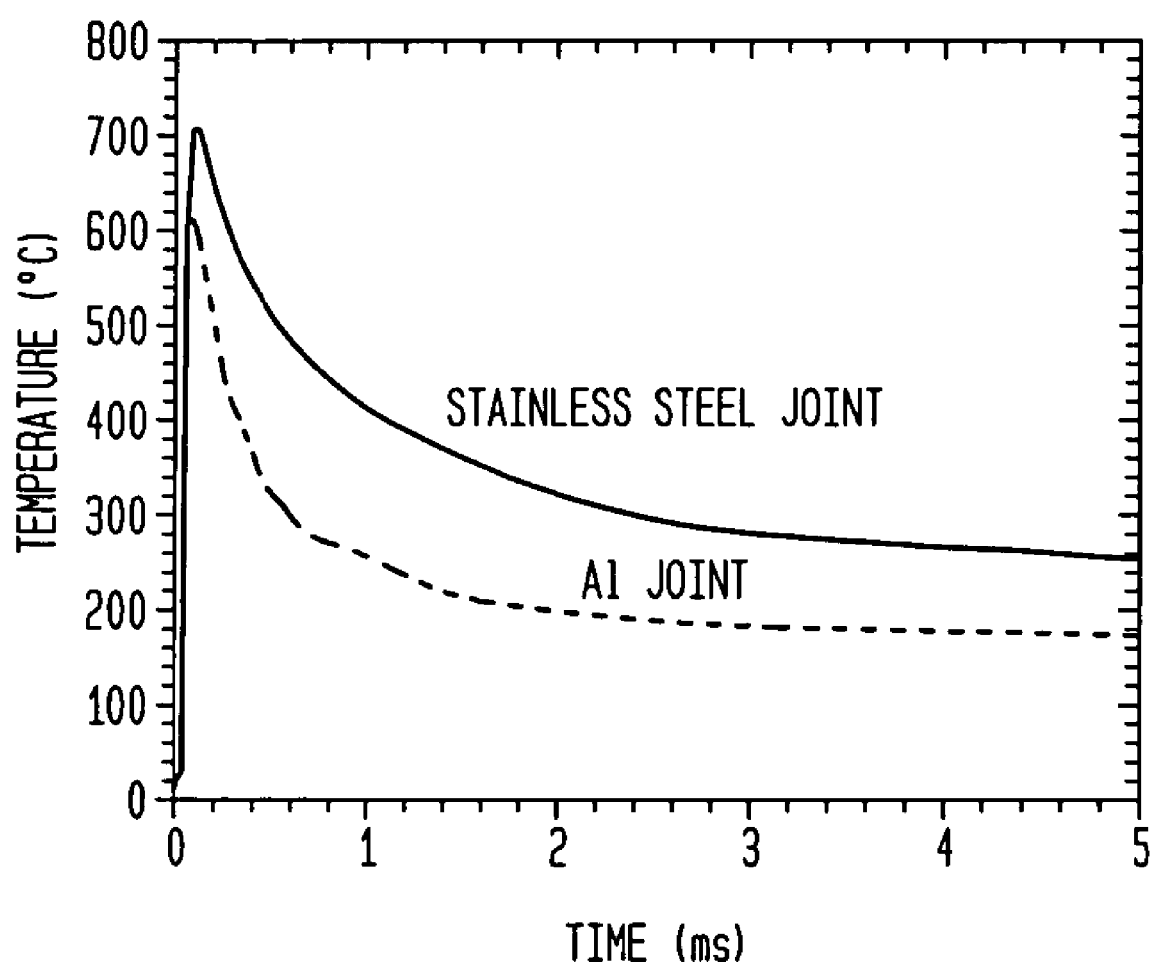
FIG. 6 is a graphical illustration plotting predicted temperature versus time at the center of AuSn solder layers made with reactive foils in (1) stainless steel and (2) aluminum joints.

In addition, the scale of the fine microstructure of the solder or braze material is dependant on cooling rate of the reactive joints which varies with geometries and properties of the foils and components. For example, the differences in thermal conductivities of stainless steel and Al also lead to differences in cooling rate following reactive joining. FIG. 6 is a plot of temperature versus time at the center of the AuSn solder layer in both stainless steel joint and Al joint made with two 25 µm thick AuSn solder layers and one 80 µm thick Al/Ni foil. The numerical predictions show that following reaction of the foil, temperature at the center of the solder layer in the stainless steel joint decreases from 700° C. to 400° C. within 1 ms, with a maximum cooling rate of $0.7 \times 10^{6\circ}$ C./s. It takes 3 ms for the center of the solder layer to cool down to its melting temperature, 280° C. The cooling rate at the center of the solder layer is $2 \times 10^{4\circ}$ C./s at this moment. The Al joint cools faster than the stainless steel joint and temperature at the center of the solder layer decreases from 600° C. to 260° C. within 1 ms, with a higher maximum cooling rate of $1.1 \times 10^{6\circ}$ C./s. It takes 0.7 ms for the center of the solder layer to cool down to its melting temperature, 280° C. At this moment, the cooling rate at the center of the solder layer is $1.1 \times 10^{5\circ}$ C./s.

Figure 7A:
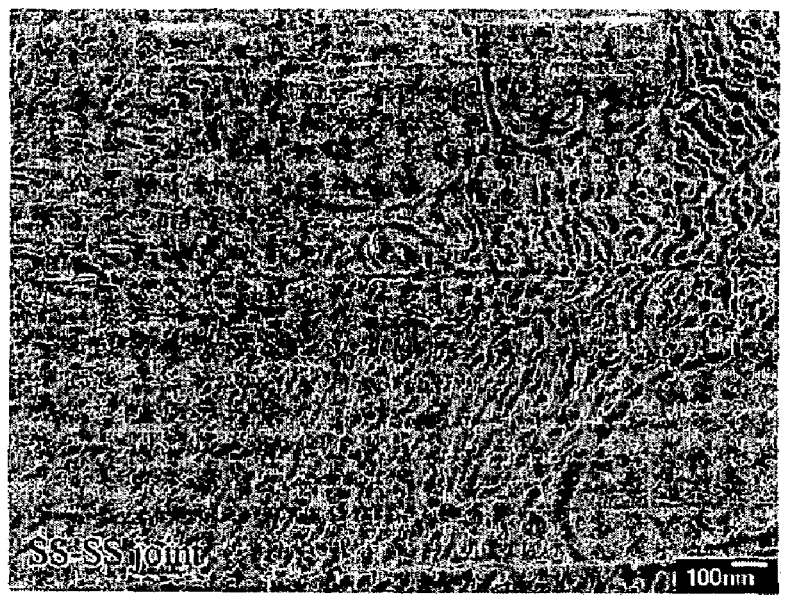
FIGS. 7A and 7B are micrographs depicting fine lamellar entectic structure of AuSn solder in (A) reactive foil joined stainless steel and (B) reactive foil joined aluminum.
Figure 7B:
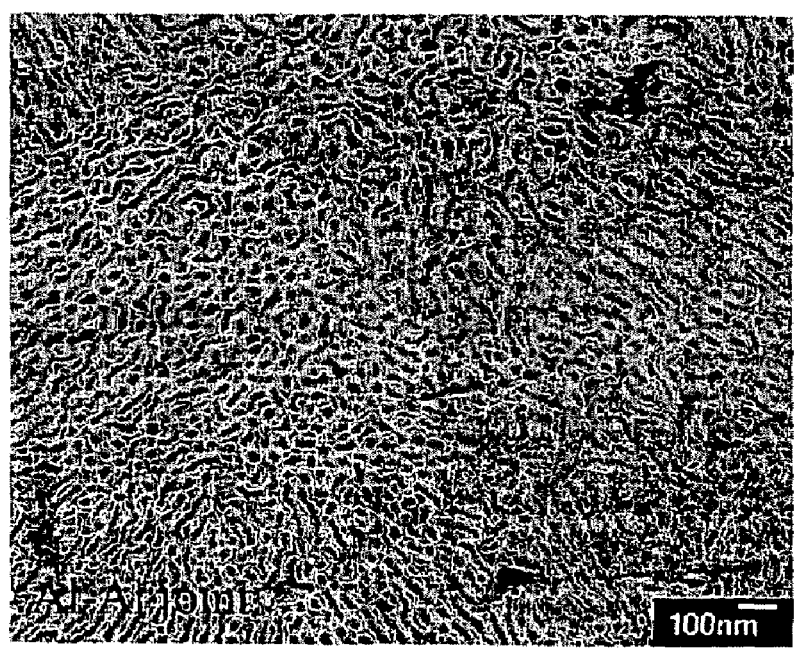

The difference in cooling rates will impact microstructures of the solder layers as seen in FIG. 7. The microstructures of the AuSn solder in an Al joint and a stainless steel joint, both made with 80 µm thick Al/Ni foils and 25 µm thick AuSn solder layers, are shown in FIGS. 7(*a*) and 7(*b*). In both stainless steel and Al joints, a very fine lamellar eutectic structure is observed, including a light Au rich phase and a dark Sn rich phase. The formation of the fine lamellar structure is due to the very rapid cooling of the reactive joint. The lamellar spacings of the AuSn solder in the stainless steel joint and the Al joint are approximately 30 nm and 20 nm, respectively. The microstructure of the solder layer, in turn, will impact joint strength if failure occurs in the solder layer.

II. A Thermal Modeling Technique Useful For Optimizing The Microstructure of Reactive Foil Joints In one embodiment of this invention, a computational model formulation is used for choosing a reactive foil that will optimize the microstructure of a joint. The model is applied by discretizing (i.e., making mathematically discrete; defining for a finite or countable set of values; not continuous) an unsteady energy equation in a computational domain (e.g., including computational inputs and/or boundaries) that includes one or more properties of the reactive multilayer foil, the surrounding joining layers (e.g., solder and/or braze) and the components to be joined. In one example, this discretization is implemented by integrating the model formula set forth herein using as inputs various dimensions and physical properties of one or more of the reactive multilayer foil, the surrounding joining layers, and the components, as well as boundary conditions of the computational domain. One example includes a two-dimensional discretization in which the domains representing the foil, joining layers and the components are rectangular domains, each specified in terms of its length and thickness.

The embodiments below provide specific illustration of such configurations, where a heat release rate $\dot{q}$ corresponds to an essentially flat self-propagating energy front traveling along the length of the reactive multilayer foil (e.g., the energy or heat wave front produced across one or more of the reactive multilayer foil, the surrounding joining layers, and the components when the reactive multilayer foil is ignited). For such implementation, inputs to the computational model include: (a) the dimensions (length and thickness) of the components, solder and/or braze layers, and the reactive foil, (b) the density, heat capacity, and thermal conductivity of the components, (c) the density, heat capacity, thermal conductivity, heat of fusion, and melting temperature of the solder and/or braze layers, (d) the heat of reaction and the propagation velocity, (e) the ignition location, (f) the density, heat capacity, thermal conductivity, heat of fusion, and melting temperature of the product of reaction in the reactive multilayer, and (g) thermal and mass flux conditions on domain boundaries. Computational solution of the discretized model equations then provides the transient evolution of the thermal waves within the foil, the joining layers, and the components.

For example, application of the model may include providing the length, width, and thickness of each of a reactive multilayer foil, a first component, a second component, a first joining layer, and a second joining layer. Using these respective lengths, widths, and thicknesses as inputs, as well as thermal and mass flux conditions on domain boundaries, the formula set forth below is integrated for each of the reactive multilayer foil, the first component, the second component, the first joining layer, and the second joining layer. When integrated, the output is the prediction of a how an energy or thermal wave front will propagate in each of the reactive multilayer foil, the first component, the second component, the first joining layer, and the second joining layer when the reactive multilayer nanofoil is ignited.

Any of the aforementioned predictions of the computational model formulation (e.g., the prediction of how the energy or heat wavefront will behave in each of the reactive multilayer foil, the first component, the second component, the first joining layer, and the second joining layer) may be used to assess the magnitude and duration of various joining parameters such as melting of the solder and/or braze layers, the wetting of critical interfaces, and the thermal exposure of the components. The model can thus predict insufficient melting of the solder and/or braze, lack of wetting at critical interface, excessively short melting duration, or excessive thermal exposure of the components, in which case the parameters of the reactive joining configuration can be systematically altered. The model can be reapplied to the altered configuration to verify whether the parameters are suitable. Examples include systematic variation of the thickness of the foil and the thicknesses of the solder and/or braze layers, the heat of reaction (for instance by altering the composition or microstructure), and/or the solder material. Such systematic variation of parameters can be iteratively applied until a suitable configuration is determined. It should be evident for one skilled in the art how to generalize such an iterative approach to include other configuration parameters and iteration methods. For example, the inputs to the model may be any combination of any of the physical properties of any of the materials set forth herein.

Embodiments of the invention include a multi-dimensional computational code for simulating the reactive joining process. The code may be run and/or stored on a computer or any other suitable computer readable medium. The code may be an implementation of a multi-dimensional transient formulation of an energy equation that accounts for the properties of the self-propagating reaction as well as the physical properties of the reactive nanofoil, the fusible materials, and/or the components. The computational model formulation consistent with the present invention will next be described.

The multi-dimensional transient formula may be based on a specially-tailored mathematical formulation that combines the unsteady energy equation:

$$\rho \frac{\partial h}{\partial t} \nabla \cdot q + \dot{Q} \qquad (1)$$

with a simplified description of the reaction front represented by $\dot{Q}$. In Eq. (1), h denotes the enthalpy, $\rho$ is the density, t is time, q is the heat flux vector, and $\dot{Q}$ is the heat release rate. The enthalpy, h, is related to the temperature, T, through a detailed relationship that involves the material's heat capacity, $c_p$, and the latent heat, $h_f$. The term $\dot{Q}$ represents the rate of heat released by the self-propagating front as it traverses the reactive foil. The latter is described in terms of a thin front that propagates in the direction normal to its surface. The propagation speed is prescribed using either measured or computed values. Examples of the measured and computed propagation speeds are shown in FIG. 13(b). The strength of $\dot{Q}$ is thus obtained by combining the known reaction velocity and heat of reaction for a given reactive foil. Note that $\dot{Q}$ is localized within the front that traverses the nanofoil, and vanishes in within the one or more fusible materials and/or components.

The propagation of the heat or energy wave (e.g., evolution of the temperature) within the configuration, as well as the evolution of the melting and/or solidification of the one or more fusible materials, may be determined by integrating Eq. (1) over the entire configuration. A transient finite-difference computational model of the above formulation has been developed for this purpose. The finite-difference discretization is based on dividing the domain into computational cells of fixed grid size. Enthalpy is defined at cell centers, while fluxes are defined at cell edges. Second-order centered-difference approximations are used to approximate spatial derivatives. This spatial discretization scheme results in a finite set of coupled ordinary differential equations (ODEs) that govern the evolution of the enthalpy at the cell centers. The set of ODEs is integrated in time using the explicit, third-order Adams Bashforth scheme. Based on the resulting solution, one can readily determine various properties of the reactive joining process, including the amount of solder that melts at a specific cross-section or spatial location, the corresponding melting duration, as well as the temperature evolution within the foil, solder or braze layers, and the components. It should be evident for someone skilled in the art how to implement various alternative spatial discretizations of arbitrary order, including as finite-element, spectral-element, or collocation approximations, as well as various implicit, explicit, or semi-implicit time-integration schemes.

Note that, in the case of a one-dimensional (or flat) reaction front, an equivalent steady formulation of Eq. (1) may be derived by recasting the equations of motion in a moving reference system that travels at the same speed as the reaction front (e.g., temperature and other measurements may be taken at various positions along a line that is substantially perpendicular to the surfaces one or more of the reactive multilayer nanofoil, the joining layers, and/or the components). This alternative formulation, however, may have several drawbacks, including difficulties in specifying the variation of the thermal interface resistance with temperature (e.g., pre-reaction and/or post-reaction), in post-processing and data analysis (e.g., duration of melting), and in comparison with experimental measurements. Also note that when the interfaces between adjacent layers are not initially bonded, the formulation may accommodate a thermal interface resistance, and account for the variation of the thermal interface resistance as melting occurs along these interfaces.

The simulation results may be used to determine the degree of melting of the fusible materials that occurs within the reactive joining process, as well as the time duration over which wetting occurs at critical interfaces. As used in this application, a critical interface is an interface that requires wetting in order to form a suitable bond at the interface. In most cases, a critical interface is one that is initially unbonded. The critical interfaces in arrangements may vary depending on the parts (e.g., reactive nanofoils, fusible materials, and/or components) and the configuration of the parts in the particular arrangement.

Figure 8A:
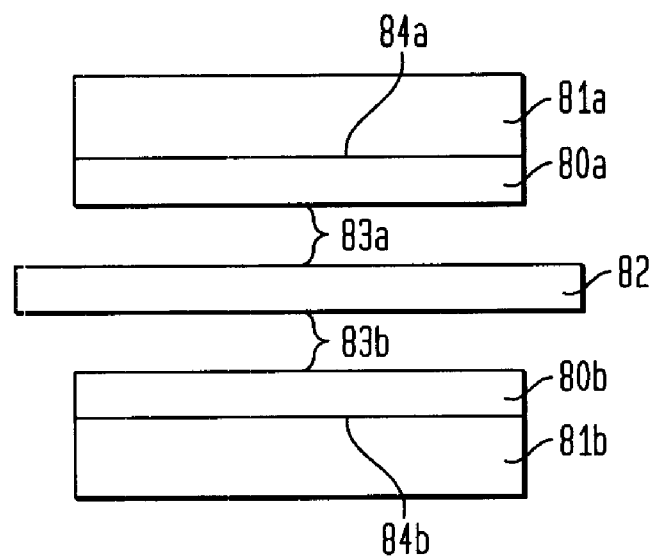
FIG. 8(a) depicts a schematic view of a first reactive multilayer joining configuration.
Figure 8B:
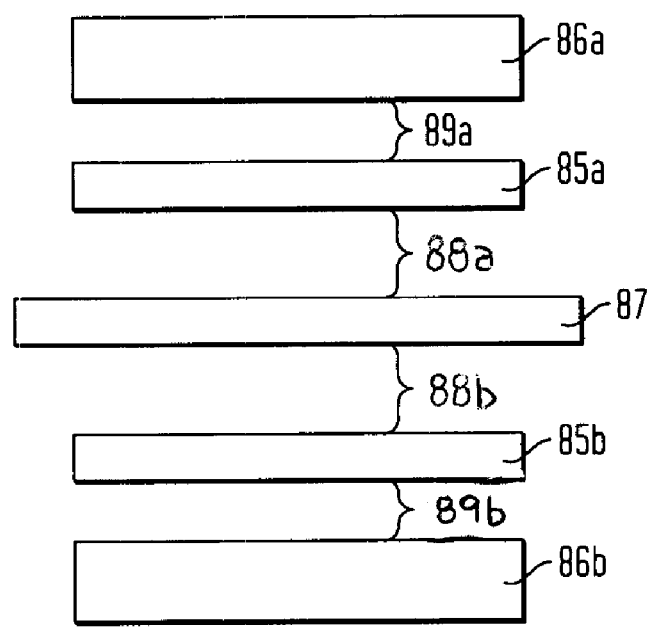
FIG. 8(b) depicts a schematic view of a second reactive multilayer joining configuration.

FIGS. 8(a) and 8(b) depict examples of critical interfaces. As shown in FIG. 8(a), one or more fusible materials 80a, 80b may be pre-deposited onto one or more components 81a, 81b so that a suitable bond may be provided, prior to chemical transformation (e.g., ignition) of the nanofoil 82, between the one or more fusible material 80a, 80b and the one or more components 81a, 81b. Thus, the critical interfaces in FIG. 8(a) are at the interfaces 83a, 83b between the nanofoil 82 and the fusible materials 80a, 80b, and not at the interfaces 84a, 84b between the fusible materials 80a, 80b and the components 81a, 81b. For this arrangement, suitable parts (e.g., reactive nanofoils, fusible materials, and/or components) may be selected (e.g., taking into consideration size, shape, and/or composition) and/or particularly positioned such that, when the reactive nanofoil 82 is chemically transformed (e.g., ignited), the heat from the ignited reactive nanofoil 82 may cause only a portion of the layers of the fusible material 80a, 80b to melt. In other words, the heat from the ignited reactive nanofoil 82 may not effect a complete melting of the fusible material 80a, 80b and/or may not effect a melting the portion of the fusible material 80a, 80b that is bonded to its respective component 81a, 81b. In this arrangement, the melting of all of the fusible material 80a, 80b and/or melting of the fusible material 80a, 80b that is bonded to the component 81a, 81b may be undesirable for several reasons. First, to generate enough heat to completely melt the fusible material 80a, 80b, a thicker and/or more energetic nanofoil 82 (e.g., having a more powerful chemical composition) may be necessary, which may unnecessarily increase the cost of the procedure. Second, melting the fusible material 80a, 80b that may be bonded to the component 81a, 81b may weaken the pre-existing strong bond at the interfaces 84a, 84b between the fusible materials 80a, 80b and the components 81a, 81b.

In FIG. 8(b), free-standing sheets of the fusible material 85a, 85b are disposed between the components 86a, 86b and the reactive nanofoil 87. In this case, both interfaces of the fusible material 85a, 85b are initially unbonded and, thus, both interfaces 88a, 88b, 89a, 89b of the fusible material 85a, 85b (e.g., the interface 88a, 88b adjacent the reactive nanofoil 87 and/or the interface 89a, 89b adjacent the component 86a, 86b) may be considered critical interfaces 88a, 88b, 89a, 89b. Accordingly, for this arrangement, suitable parts (e.g., one or more reactive nanofoils 87, fusible materials 85a, 85b, and/or components 86a, 86b) may be selected (e.g., taking into consideration size, shape, and/or composition) and/or particularly positioned such that, when the reactive nanofoil 87 is ignited, the heat from the ignited reactive nanofoil 87 may cause a substantially complete melting of the one or more fusible materials 85a, 85b.

It is understood that the arrangements set forth in FIGS. 8(*a*) and 8(*b*) are not limiting, and that some of the aspects set forth herein may be combined, removed, altered, and/or used to implement any number of suitable arrangements and/or manufacture any number of suitable products. Based on the arrangements, what constitutes a critical interface that needs to be wetted may also vary. For example, one or more component surfaces may be untreated, or they may have a treatment layer (e.g., an adhesion underlayer of Ni and/or Au plating, a layer of a solder or braze, or both, for example, such that the layer of solder or braze is deposited onto the adhesion layer). In another example, a free-standing sheet of a fusible material may be disposed between the nanofoil and each of the components, however, the free-standing sheet may or may not be used. In a further example, the reactive multilayer nanofoil may have one or more fusible layers on one or more sides of the reactive multilayer nanofoil. In yet another example, one or more layers of a fusible material may be provided between one or more reactive multilayers and one or more components. In a yet further example, one or more reactive multilayers maybe disposed between one or more components. In such a configuration, the one or more reactive multilayers may be in direct contact with the one or more components (e.g., a particular reactive nanofoil may provide sufficient energy to effect melting of one or more components). Such a process may be called reactive welding, as opposed to reactive soldering or brazing. An example of reactive welding is disclosed in U.S. patent application Ser. No. 09/846,486 filed May 1, 2001 and entitled "Free Standing Reactive Multilayer Foils," the entirety of which is incorporated herein by reference.

In a further example, embodiments of the invention may include combining simulation results with experimental observations to determine a suitable range of conditions that can be implemented in a reactive joining method to yield a reactive joint with suitable joint properties.

Embodiments of the invention may include any configuration and combination of any of the aspects set forth herein with respect to implementing and/or manufacturing suitable reactive joints using suitable reactive joining methods. One set of embodiment may include configurations where parts (e.g., one or more reactive nanofoils, fusible materials, and/or components) are disposed substantially symmetrically about a reactive nanofoil centerline. Another set of embodiments may include configurations where parts are disposed asymmetrically about a reactive nanofoil centerline. These and other embodiments are described below.

For embodiments with symmetric configurations, the thermo-physical properties of any part at corresponding symmetrical locations on either side of the nanofoil centerline may be substantially identical. An example may be reactive joining of components made of substantially the same material and/or using substantially identical layers of the fusible material. For embodiments with asymmetric configurations, material properties may differ at corresponding symmetric locations on either side of the nanofoil. An example may include the joining of components made of dissimilar materials and/or reactive joining configurations that use different braze or solder layers on each side of the reactive nanofoil. As reflected in the model results and experimental observations disclosed herein, one of the distinctive features of the two setups may be that for symmetric configurations heat may be transported symmetrically with respect to the nanofoil centerline; a symmetric temperature distribution may accordingly prevail. In asymmetric configurations, the heat of reaction may be unequally transported with respect to nanofoil centerline, and an asymmetric temperature field may be consequently established. As further disclosed herein, these features may have an impact on thermal transport during reactive joining, and suggest new arrangements and configurations to one of ordinary skill in the art.

The technique described herein has been applied to analyze a wide variety of symmetric configurations, in particular for reactive joining of Cu components, Au-plated stainless steel (SS) components, Ti components, as well as gold-plated Al. Exemplary results obtained for Cu—Cu joints and for the joining of Au-plated stainless steel to itself and for Au-plated Al to itself are provided herein. The methods and results for the Cu—Cu joints and SS-SS joints are also applicable to other materials.

Figure 9A:
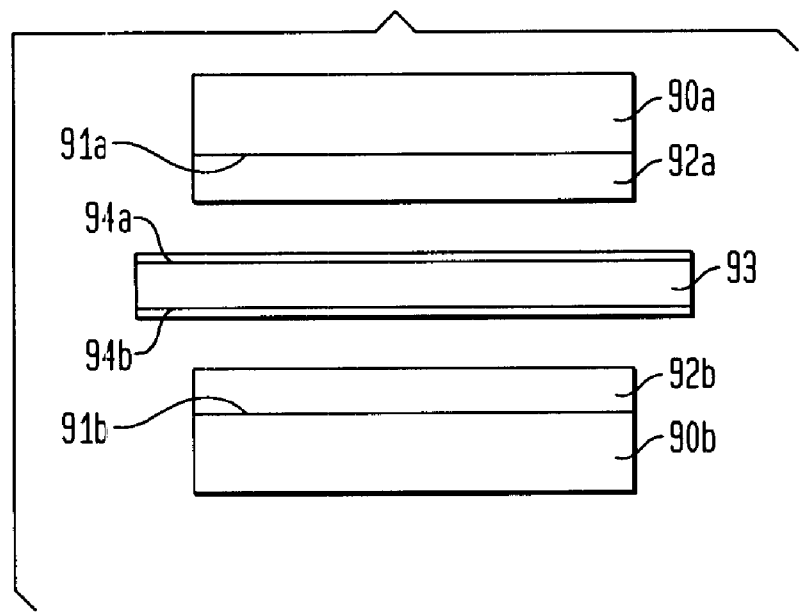
FIG. 9(a) depicts a schematic view of a third reactive multilayer joining configuration.
Figure 9B:
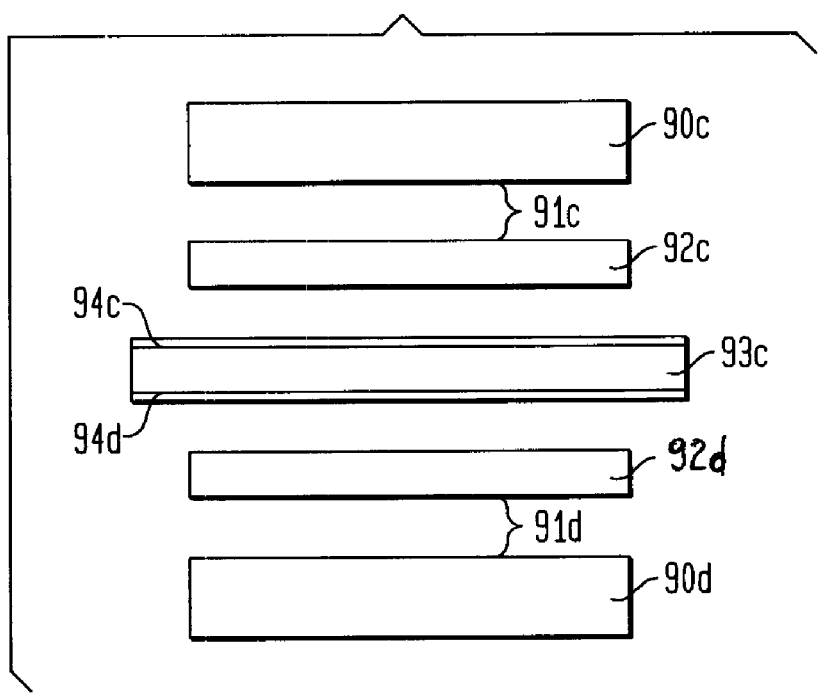
FIG. 9(b) depicts a schematic view of a fourth reactive multilayer joining configuration.

The design model is validated by comparing computed predictions to temperature measurements performed during the reaction using infrared (IR) thermometry. Results are provided for the two configurations shown in FIGS. 9(*a*) and 9(*b*), showing reactive joining of two Cu components 90a, 90b in FIG. 9(*a*) and two Au-plated stainless steel components 90c, 90d in FIG. 9(*b*). As shown in FIG. 9(*a*), the surfaces 91a, 91b of the components 90a, 90b may be pre-wet with an Ag—Sn solder layer 92a, 92b having a thickness of approximately 75 μm. The free-standing Ni—Al nanofoil 93 may have a thickness of about 55 μm, and each side of the nanofoil 93 may have about 1 μm of Incusil 94a, 94b deposited thereon. As shown in FIG. 9(*b*), free-standing sheets of Au—Sn solder 92c, 92d may have a thickness of about 25 μm and may be disposed between the reactive nanofoil 93c and the respective Au-plated stainless steel components 90c, 90d. The free-standing Ni—Al nanofoil 93c may have a thickness of about 70 μm, and each side of the nanofoil 93c may have about 1 μm of Incusil 94c, 94d deposited thereon. The materials and/or values disclosed herein are exemplary only. The present invention is application to other materials and/or dimensions.

Figure 10A:
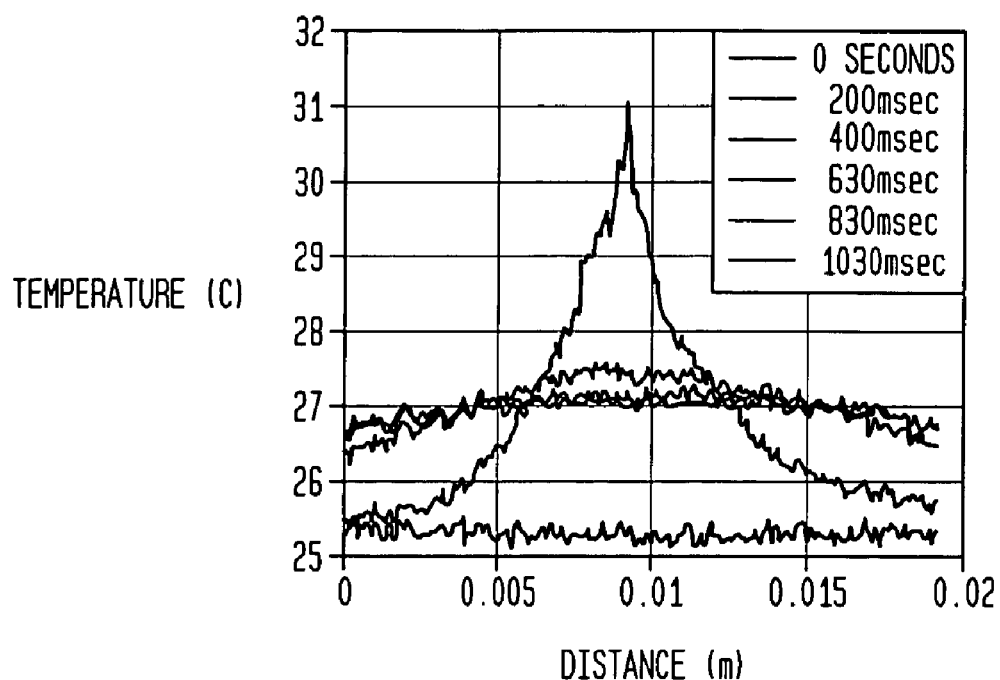
Figure 10B:
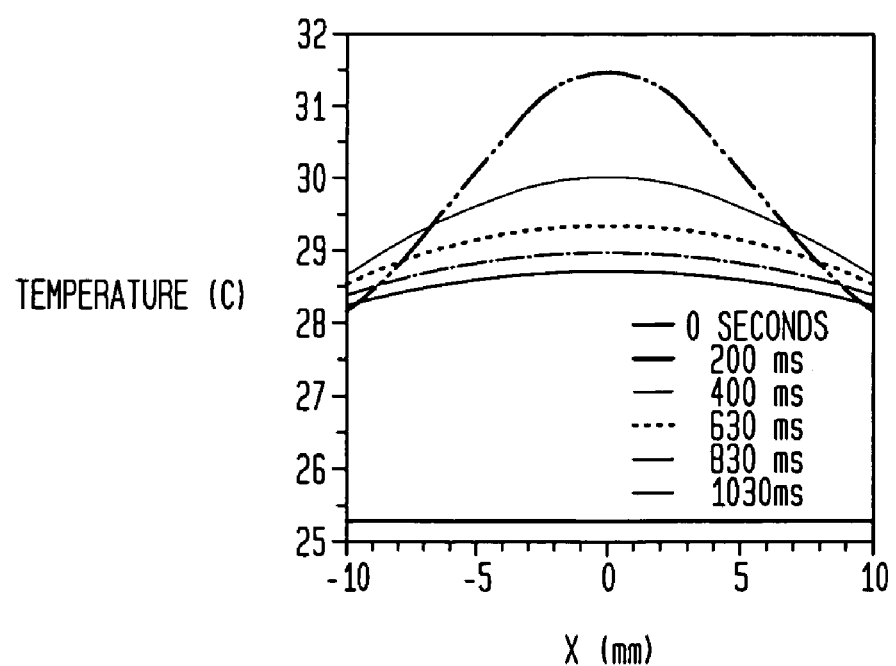

FIGS. 10(*a*) and 10(*b*) contrasts measured and predicted temperature profiles for the Cu—Cu joint configuration shown in FIG. 9(*a*). FIG. 10(*a*) illustrates the measured instantaneous temperature profiles at various times and at substantially constant positions on the Cu—Cu joint configuration during reactive joining of the Cu components. FIG. 10(*b*) discloses the predicted temperature profile at substantially the same constant positions on the Cu—Cu joint configuration during reactive joining of the Cu components, taken here at 0 seconds, 200 milliseconds, 1000 milliseconds, 630 milliseconds, 830 milliseconds, and 1030 milliseconds after ignition of the reactive multilayer nanofoil. Note the close agreement between the measured and computed peak temperatures. Also note the short duration of the reactive joining process. As can be seen in FIGS. 10(*a*) and 10(*b*), the reactive joining process is essentially complete within hundreds of milliseconds of the passage of the front (e.g., the passage of the heat or energy, usually at its peak magnitude, through various positions on one or more of the reactive multilayer nanofoil, the joining layers, and the components).

Figure 11A:
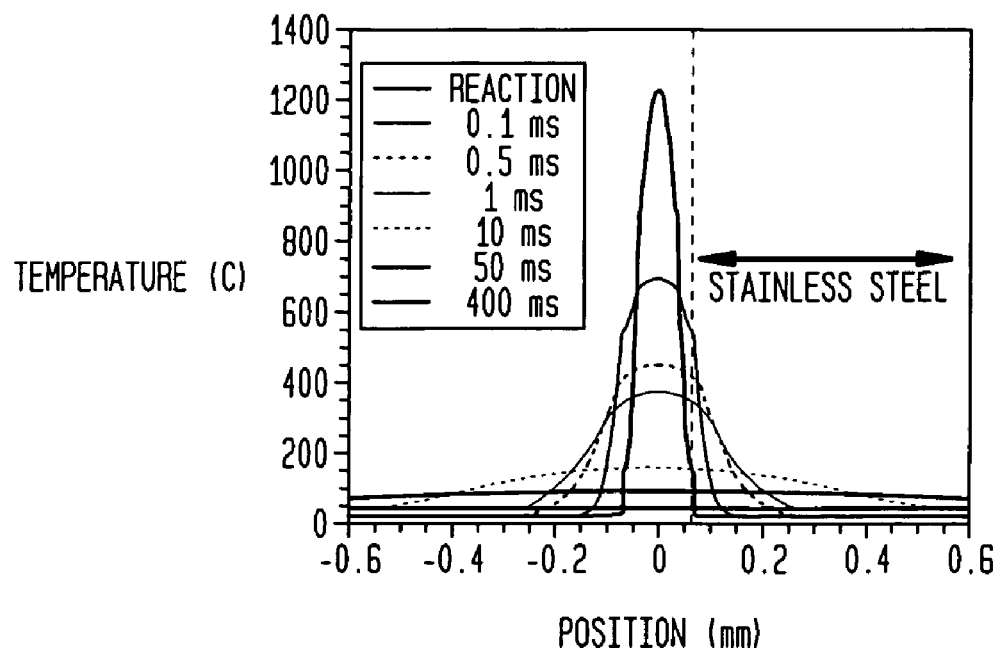
FIG. 11(a) depicts predicted temperature profiles for an example of the reactive multilayer joining configuration of FIG. 9b.
Figure 11B:
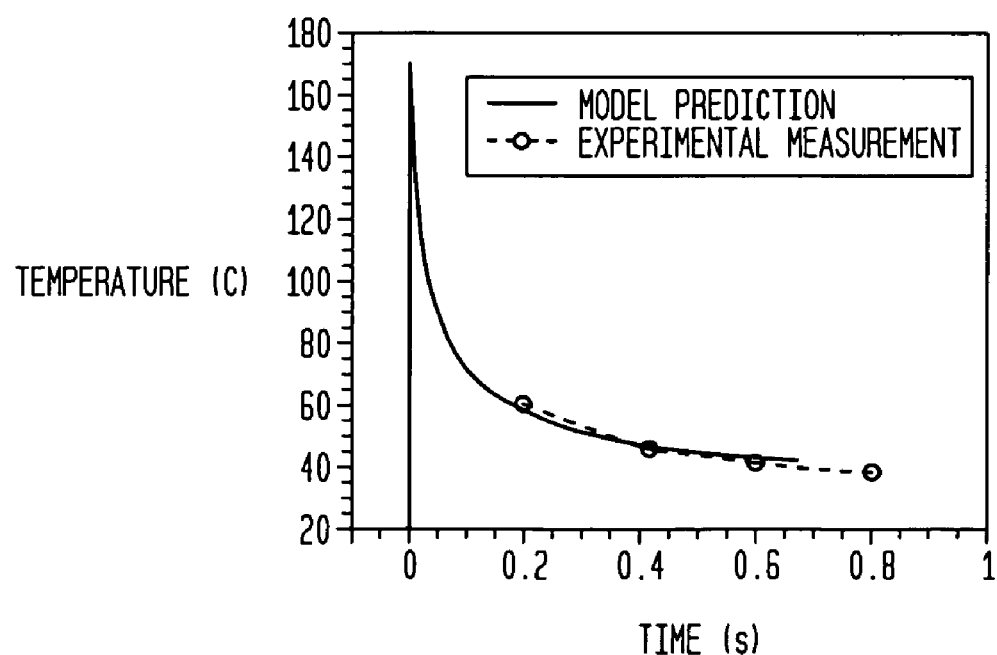
FIG. 11(b) depicts measured and predicted temperature profiles for an example of the reactive multilayer joining configuration of FIG. 9b.

FIG. 11(*a*) shows instantaneous predicted temperature profiles across the stainless steel joint configuration shown in FIG. 9(*b*). Curves are generated at the selected time instants, corresponding to the moment of passage of the self-propagating front, and at 0.1 ms, 0.5 ms, 1 ms, 10 ms, 50 ms and 400 ms afterwards. The results show that the temperature across the joint decreases very quickly to 48° C. at 400 ms after the passage of the front, which is comparable with the experimental measurement of 47° C. FIG. 11(*b*) shows the evolution of the temperature in the stainless steel configuration shown in FIG. 9(*b*) at 100 microns from the interface between the solder layer and the stainless steel. Shown are results obtained from both the numerical simulations (predictions) and the IR (actual) measurements. Note the close agreement between model predictions and experimental measurements, the rapid drop of the temperature, and the limited thermal exposure of the components.

Figure 12:
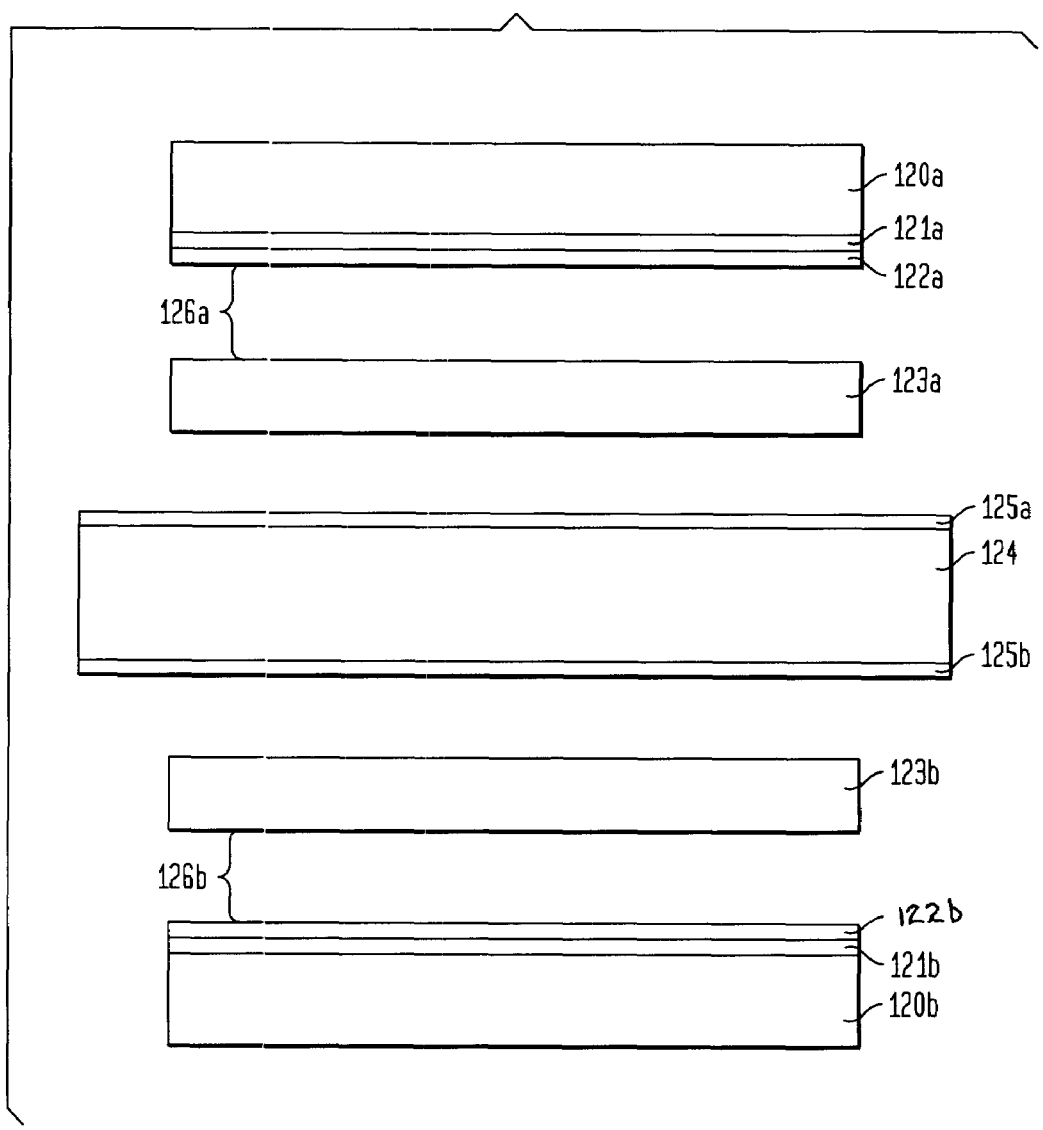
FIG. 12 depicts a schematic view of a reactive multilayer joining configuration.

The model may be applied to systematically investigate the effect of the nanofoil thickness on the wetting of critical interfaces, on the melting of the fusible material, and/or on the thermal exposure of the components. For example, FIG. 12 depicts an embodiment for the reactive joining of Al-6061T6 components 120*a*, 120*b* that may be first coated with a thin Ni underlayer 121*a*, 121*b*, and then an Au layer 122*a*, 122*b*. As shown in FIG. 12, free-standing sheets of Au—Sn solder 123*a*, 123*b* may have a thickness of about 25 µm and may be used as the fusible material 123*a*, 123*b*. Each side of the nanofoil 124 may have about 1 µm of Incusil 125*a*, 125*b* deposited thereon The effect of the thickness of the nanofoil 124 on the wetting of the critical interface 126*a*, 126*b* between the solder 123*a*, 123*b* and the component 120*a*, 120*b* (may or may not include one or more of layers 121*a*, 121*b*, 122*a*, 122*b*) may be analyzed by quantifying the time duration during which the solder 123*a*, 123*b* is locally in a molten state. To this end, the thickness nanofoil 124 may be systematically varied, while other parameters (e.g., of the nanofoil 124, layers 121*a*, 121*b*, 122*a*, 122*b*, 125*a*, 125*b*, and/or fusible material 123*a*, 123*b*) may be fixed.

As described herein, the model inputs into the computation model formulation may include the thermophysical properties of the nanofoil and of the components. For example, the table below discloses possible inputs such as the thermal conductivity, heat capacity, and/or density of Al-6061-T6, Au—Sn, Incusil-ABA, Al—NiV Foil, and/or stainless steel.

| Material | Thermal Conductivity (W/m/K) | Heat Capacity (J/kg/K) | Density (kg/m³) |
|---|---|---|---|
| Al-6061-T6 | 167 | 896 | 2700 |
| AuSn | 57 | 170 | 14510 |
| Incusil-ABA | 70 | 276 | 9700 |
| Al—NiV Foil | 152 | 830 | 5665 |
| Stainless Steel | 18 | 500 | 7990 |

Other possible inputs may include the solidus temperature of Incusil ($T_s$=878K), the liquidus temperature of Incusil ($T_l$=988K), the heat of fusion Incusil ($H_f$=10792 J/mol), the solidus temperature of Au—Sn solder ($T_s$=553K), the liquidus temperature of Au—Sn solder ($T_l$=553K), and/or the heat of fusion of Au—Sn solder ($H_f$=6188 J/mol).

Figure 13A:
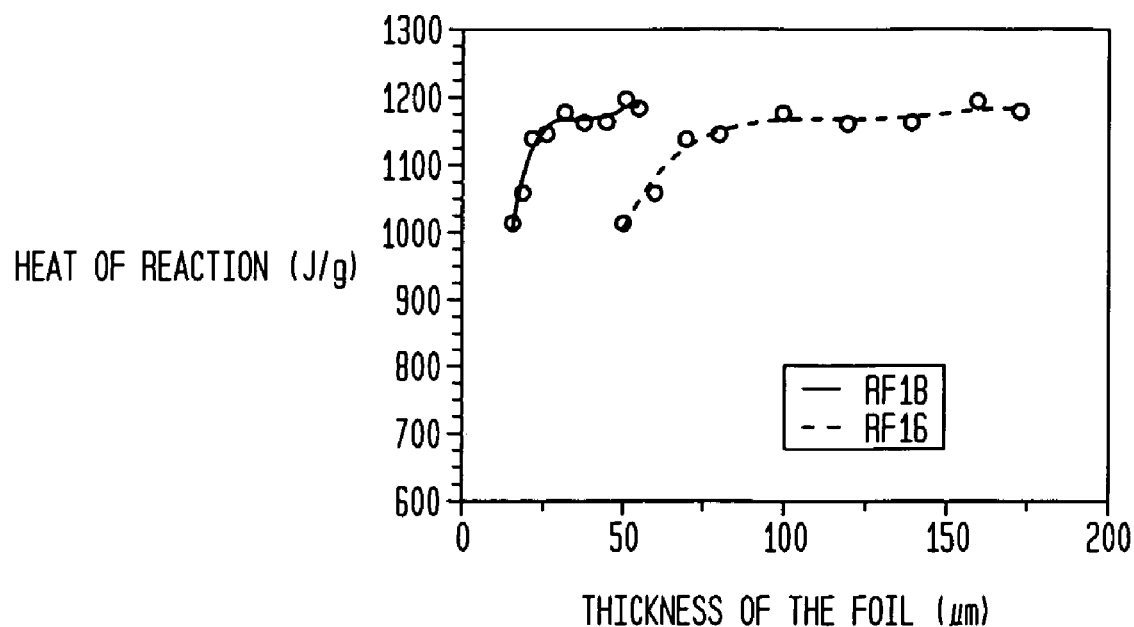
FIG. 13(a) depicts an exemplary graphical display of a relationship between foil thickness and heat of reaction.
Figure 13B:
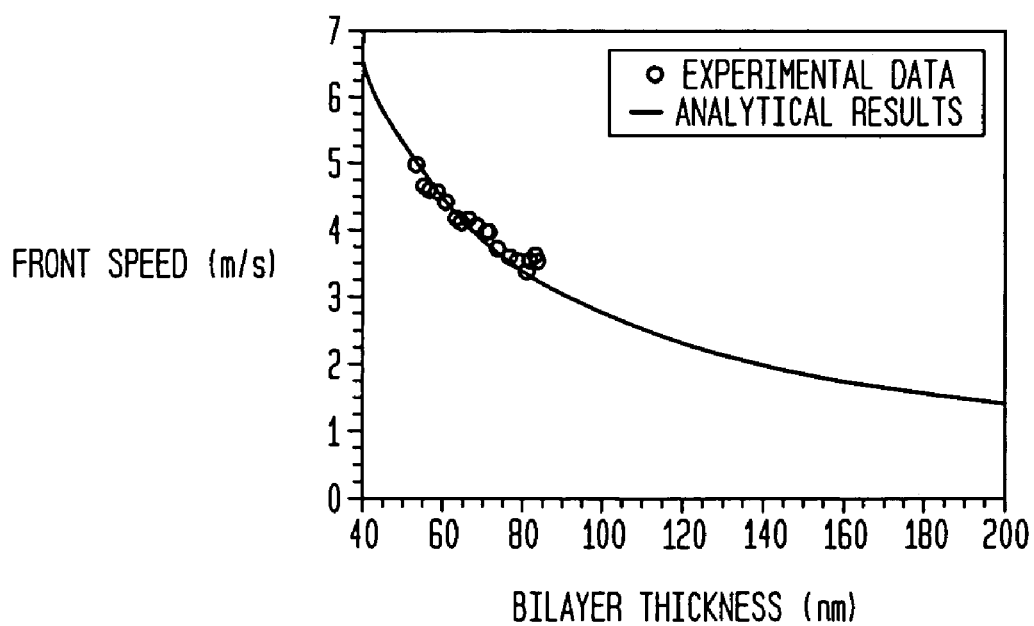
FIG. 13(b) depicts an exemplary graphical display of a relationship between foil thickness and front velocity.

Both predicted and measured values based on foil bilayer thickness are depicted in FIGS. 13(*a*) and 13(*b*). FIG. 13(*a*) shows how the heat of reaction may be affected by Al—Ni foil thickness for "thick" foils (e.g., RF16 having about 2000 bilayers) and "thin" foils (e.g., RF18 having about 640 bilayers). The lines depict the predicted heat of reaction given a particular bilayer thickness of the Al—Ni foil while the circles depict the measured heat of reaction of bilayers having a particular thickness. Note that the predicted heat of reactions substantially correlate with the measured heat of reactions. In a further example, FIG. 13(*b*) depicts how front velocity (speed) is dependent on bilayer thickness. The line shown in FIG. 13(*b*) depicts the predicted front velocity given a particular bilayer thickness of the Al—Ni foil while the circles depict the measured front velocity of bilayers having a particular thickness. Note that the predicted front velocities substantially correlate with the measured front velocities.

Figure 14:
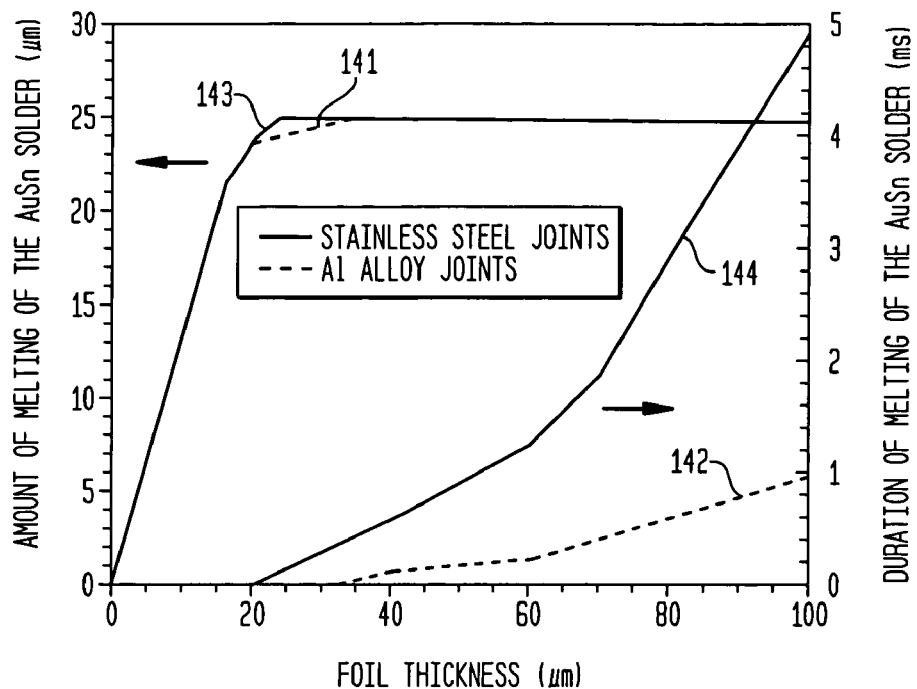
FIG. 14 depicts exemplary graphical results for the reactive multilayer joining configurations of FIG. 9(b) and FIG. 12.

FIG. 14 depicts computed predictions for the amount of melting of the solder layer as well as the duration of melting at the critical solder-component interface as a function of nanofoil thickness. The dashed line represents results that may be obtained for reactive joining of Al—Al components, for example, as shown in the configuration depicted in FIG. 9(*b*), while the solid line represents results that may be obtained for reactive joining of Au-plated stainless steel components, for example, as shown in the configuration depicted in FIG. 12.

For Al—Al joints, the model predictions in FIG. 14 indicate that when the nanofoil thickness is smaller than about 35 µm, only partial melting of the about 25 µm-thick layers of Au—Sn solder may occur. Accordingly, the duration of melting at the critical interface between the solder and the component may be about 0 ms. On the other hand, when a nanofoil having a thickness substantially equal to or greater than about 35 µm is used, the entire solder layer may melt and the duration of wetting of the critical interface (e.g., duration of melting of at least a portion of the Au—Sn solder layer) may be positive. In particular, the duration of melting may increase as the nanofoil thickness increases. The model prediction also indicates that the minimum nanofoil thickness needed to melt the about 25 µm-thick layer of Au—Sn solder may be larger for the Al—Al joints than for the SS-SS joints. Furthermore, for corresponding nanofoil thicknesses (e.g., greater than about 20 µm), the model predicts that the duration of melting of the solder layer may be larger (and as the nanofoil thickness increases, substantially larger) for the SS-SS joints than for the Al—Al joints. This may be due to the fact that the thermal conductivity of stainless steel may be much smaller than that of Al-6061-T6. Consequently, heat may be conducted at a much slower rate into the SS than in the Al. These predicted results underscore the need for a careful optimization of the design, configuration, and/or dimensions of reactive joining configurations (e.g., nanofoil thickness), based on the thermophysical properties of the reactive multilayer, of the fusible materials, and/or of the components.

Additional numerical predictions of the model (e.g., associated with the melting of the fusible material and/or of wetting of critical interfaces) may be contrasted with additional experimental measurements, for example, the shear strength of the reactive joints.

Figure 15:
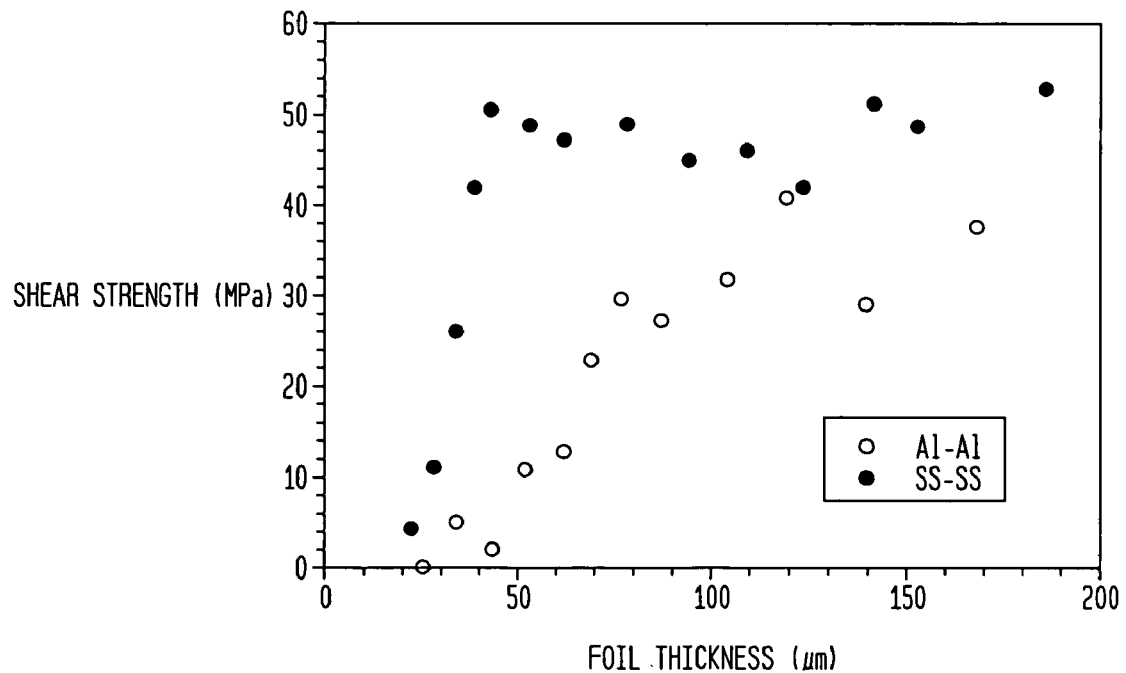
FIG. 15 depicts exemplary graphical results for the reactive multilayer joining configurations of FIG. 9(b) and FIG. 12.

For example, FIG. 15 shows that the measured shear strength of the Al—Al joints and/or SS-SS joints may be associated with and/or dependent on nanofoil thickness. For the present tests, the foils that are thicker than about 55 µm correspond to the RF16 family (e.g., have about 2000 bilayers), while the foils that are thinner than about 55 µm correspond to the RF18 family (e.g., having about 640 bilayers). The joint strengths were measured using tensile shear-lap tests. Consistent with the predictions set forth in FIG. 14, the measurements of FIG. 15 indicate that successful joints may be obtained when the thickness of the reactive nanofoil for an Al—Al joint is about 35 µm, and when the thickness of the reactive nanofoil for a SS-SS joint is about 20 µm. Specifically, FIG. 15 shows that Al—Al joints may fail when the reactive nanofoil is thinner than about 35 µm and/or that SS-SS joints may fail when the nanofoil thickness is less than about 20 µm. The measurements set forth in FIG. 15 also show that the respective joint strengths may steadily increase with increases in the thicknesses of the respective nanofoils until a plateau and/or peak strength is reached. Once that peak and/or plateau is reached, the joint strength may remain constant and/or no further strength may be imparted to the joint even with successive increases in nanofoil thickness. For SS-SS joints, the plateau may be reached when the nanofoil is thicker than about 42 µm, and for Al—Al joints, the peak strength may be reached when the nanofoil is about 80 µm thick.

Accordingly, by using the model predictions of FIG. 14 and the measured results of FIG. 15, one may be able to correlate the optimal and/or maximum strength of a particular joint with the time duration during which the solder remains in a molten state at the critical interface. For example, for the present configurations, one may be able to conclude that the Au—Sn solder must wet the critical interface for about 0.5 ms in order to achieve an optimal and/or maximum strength bond. The bond strength may also be affected by other parameters of the present configurations, for example, the peak temperature at the interface between the fusible material and the component. The predictions and/or corresponding measurements set forth herein hold for both the Al—Al and SS-SS joints. It should be evident for one skilled in the art to generalize the present embodiment to a variety of other material systems.

Figure 16:
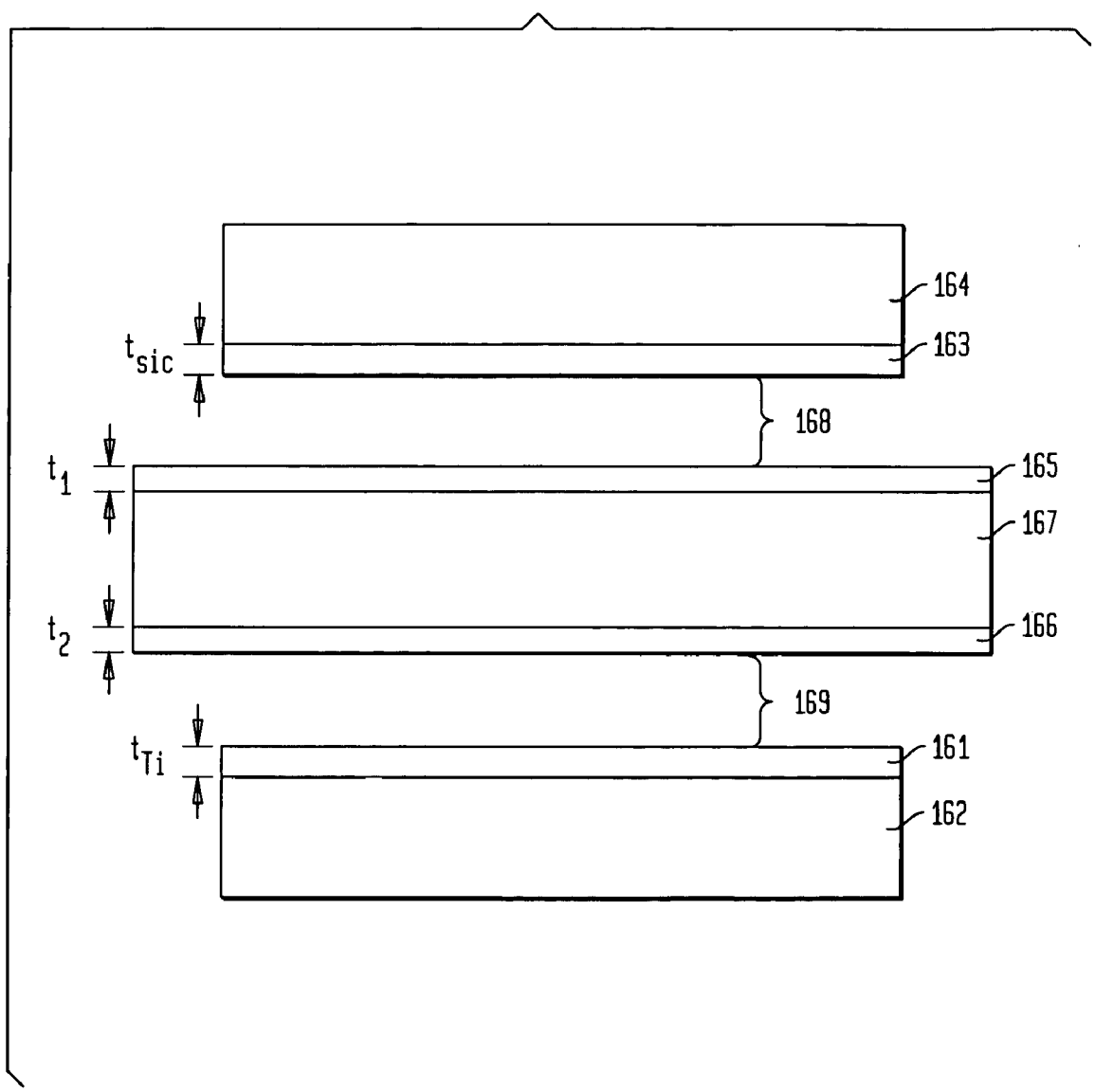
FIG. 16 depicts a schematic view of a reactive multilayer joining configuration.

The design approach set forth herein may be applied to analyze asymmetric configurations (i.e., configurations where properties of the materials, such as thermal properties, may differ on different sides of the nanofoil). An example of such an asymmetric configuration is shown in FIG. 16, which illustrates the reactive joining of SiC to Ti-6-4, in which the thicknesses of the Incusil layers that are pre-deposited onto the SiC and Ti may be held fixed.

Figure 17A:
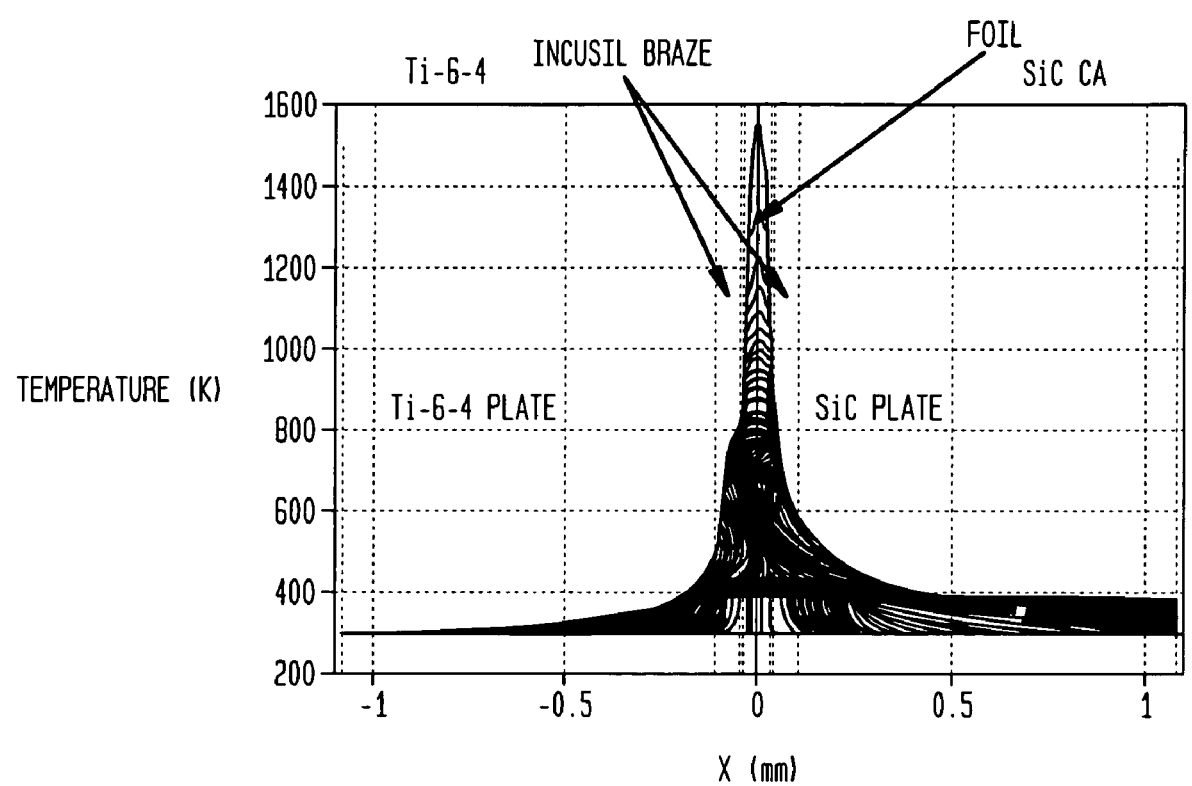
FIG. 17(a) depicts exemplary predicted temperature profiles of the reactive multilayer joining configuration of FIG. 16.
Figure 17B:
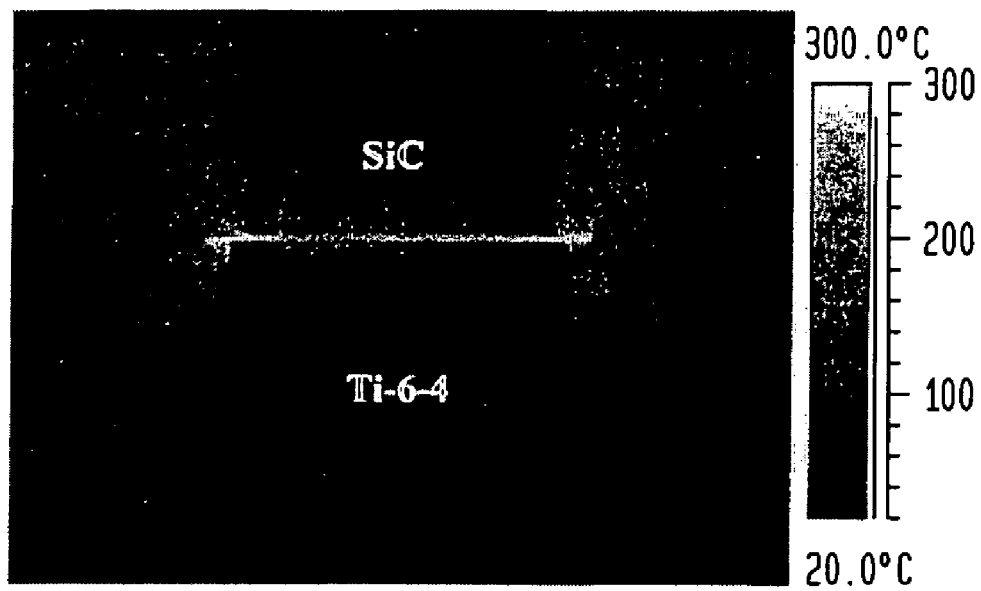
FIG. 17(b) depicts an exemplary measured infrared temperature distribution of the reactive multilayer joining configuration of FIG. 16.
Figure 17C:
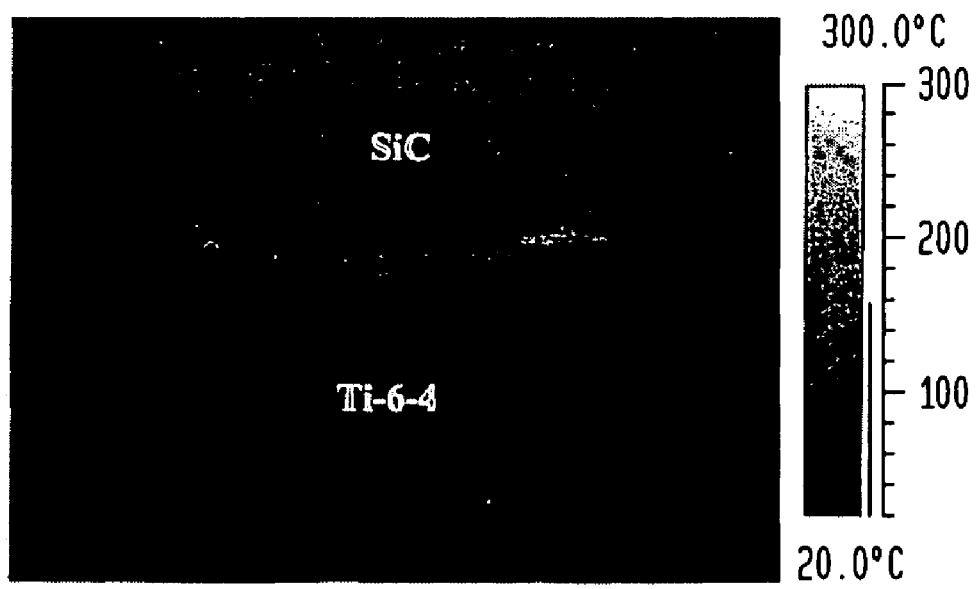
FIG. 17(c) depicts an exemplary measured infrared temperature distribution of the reactive multilayer joining configuration of FIG. 16.

As SiC may have a much larger thermal conductivity than Ti-6-4, the thermal profile during the reactive joining may be asymmetric with respect to the nanofoil centerline. Such asymmetry in the thermal profile of across the SiC and Ti-6-4 assembly is shown in FIG. 17(a), which graphically shows that the thermal wave may diffuse faster on the SiC side than on the Ti. Moreover, the peak temperatures may be generally higher on the Ti side than on the SiC side. Similar effects (e.g., faster diffusing on the SiC side than on the Ti side and/or higher peak temperature on the Ti side than on the SiC side) may be observed by analysis of IR thermometry images of the SiC—Ti assembly during reactive joining, exemplary samples of are shown in FIGS. 17(b) and 17(c). FIG. 17(b) shows an IR image of the configuration at the ignition of the reactive multilayer nanofoil, while FIG. 17(c) shows an IR image of the configuration at about 240 ms after ignition. As further discussed herein, this understanding of the thermal properties of an asymmetric joining configuration may be used to design new reactive joining configurations.

Returning to FIG. 16, the thickness of an Incusil layer 161 that may be pre-deposited onto the Ti 162 may be about 62 µm thick, while the Incusil layer 163 that is pre-deposited onto the SiC164 may be about 100 µm thick. In this particular design analysis, as set forth below, a parametric study may first be conducted of the effect of the thicknesses of the braze layers 165, 166 pre-deposited on both sides of the reactive nanofoil 167. To this end, the thicknesses of the braze layers 165, 166 facing the SiC ($t_1$ in FIG. 16) and Ti ($t_2$ in FIG. 16) may be varied independently. Meanwhile, the overall thickness (180 µm), reaction heat (1189 J/g) and reaction velocity (2.9 m/s) of the nanofoil 167 and the thicknesses of the adjoining layers 165, 166 may be held fixed. The nanofoils used in the analysis of SiC/Ti-6-4 joints may correspond to the RF16 family, whose properties are shown in FIG. 13. Other inputs to the design model are provided in the table below.

| Material | Thermal Conductivity (W/m/K) | Heat Capacity (J/kg/K) | Density (kg/m³) |
| --- | --- | --- | --- |
| SiC | 130 | 750 | 3200 |
| Ti-6-4 | 6.7 | 610 | 4510 |
| Incusil-ABA | 70 | 276 | 9700 |
| Ni/Al Foil | 152 | 830 | 5665 |

Other possible inputs may include the solidus temperature in Incusil ($T_s$=878K), the liquidus temperature of Incusil ($T_l$=988K), and the heat of fusion of Incusil ($H_f$=10,792 J/mol).

The model coniputations for FIG. 16 focused on the wetting of the critical interfaces, which in the present case correspond to the interfaces 168, 169 between the Incusil layers 165, 166 pre-deposited onto the nanofoil 167 and the Incusil layers 161, 163 pre-deposited onto their respective components 162, 164. Specifically, for the arrangement shown in FIG. 16, it may be necessary for the reaction to produce sufficient heat so as to melt the braze layers 165, 166 that are pre-deposited onto the nanofoil 167, as well as partially melt the braze layers 161, 163 that are pre-deposited onto the Ti 162 and the SiC 164. In the computations, we quantify this phenomenon (e.g., melting of the one or more braze layers) by monitoring the peak thicknesses of the molten braze layers 163, 161 on the SiC 164 and Ti 162, respectively $t_{SiC}$ and $t_{Ti}$. The following table shows the various thicknesses $t_{SiC}$, $t_{Ti}$ of molten braze layers 163, 161 (i.e., amount of melting of the braze) for various combinations of the thicknesses $t_1$, $t_2$ of the one or more braze layers 165, 166 pre-deposited on the nanofoil 167.

| $t_1$ (µm) | $t_2$ (µm) | $t_{SiC}$ (µm) | $t_{Ti}$ (µm) |
| --- | --- | --- | --- |
| 1 | 1 | 19.32 | 45.95 |
| 1 | 4 | 19.36 | 35.05 |
| 1 | 8 | 19.40 | 27.03 |
| 1 | 12 | 19.44 | 19.87 |
| 1 | 16 | 19.48 | 13.84 |
| 4 | 1 | 15.49 | 47.54 |
| 4 | 4 | 15.54 | 35.39 |
| 4 | 8 | 15.57 | 27.24 |
| 4 | 12 | 15.62 | 21.03 |
| 4 | 16 | 15.66 | 13.99 |
| 8 | 1 | 11.50 | 47.95 |
| 8 | 4 | 11.55 | 35.63 |
| 8 | 8 | 11.58 | 27.38 |
| 8 | 12 | 11.62 | 21.15 |
| 8 | 16 | 11.67 | 15.11 |
| 12 | 1 | 7.74 | 49.55 |
| 12 | 4 | 7.79 | 35.98 |
| 12 | 8 | 7.82 | 27.58 |
| 12 | 12 | 7.87 | 21.31 |
| 12 | 16 | 7.92 | 15.26 |
| 16 | 1 | 3.75 | 51.31 |
| 16 | 4 | 3.79 | 37.45 |
| 16 | 8 | 3.82 | 27.83 |
| 16 | 12 | 3.87 | 21.51 |
| 16 | 16 | 3.92 | 15.45 |

Figure 18:
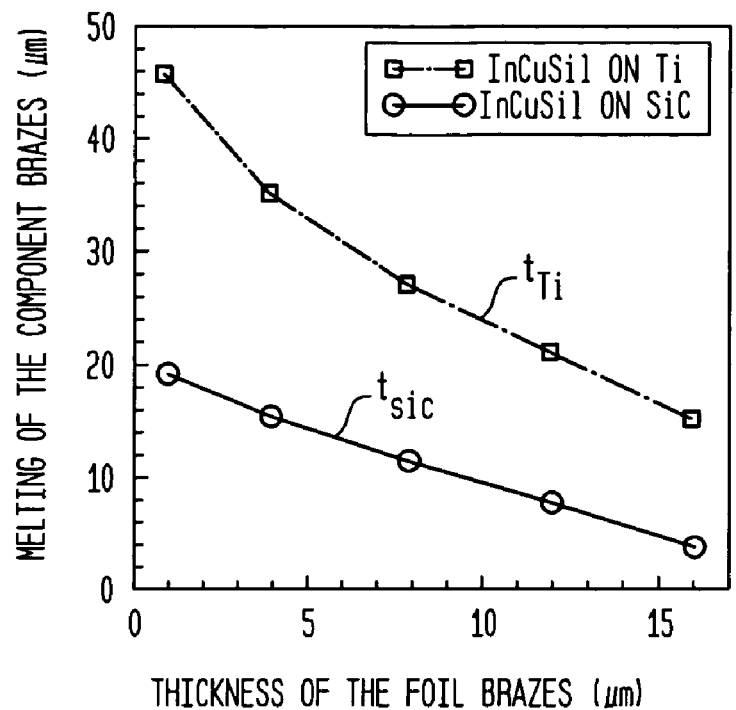
FIG. 18 depicts exemplary graphical results for the reactive multilayer joining configuration of FIG. 16.

FIG. 18 graphically shows the thickness of the molten braze layer 161, 163 as a function of the one or more braze layers 165, 166 deposited on either side of the reactive nanofoil 167 for the combinations where an equal thickness of braze 165, 166 is deposited on either side of the reactive nanofoil 167 (i.e., $t_1=t_2$). The dashed curve shows the amount of melting on the Ti component and the solid curve shows the amount of melting on the SiC component.

Examination of the results in the table above reveals that the amount of braze 163 out of $t_{SiC}$ that melts on the SiC component 164 may depend on the thickness $t_1$ of the braze layer 165 on the SiC-side of the nanofoil 167. Specifically, $t_{SiC}$ may decrease as $t_1$ increases. Similarly, the amount of braze 161 out of $t_{Ti}$ that melts on the Ti component 162 may depend on the thickness $t_2$ of the braze layer 166 on the Ti-side of the nanofoil 167, and decrease as the latter increases. This effect is graphically depicted in FIG. 18; where both curves ($t_{SiC}$ and $t_{Ti}$) decrease as one increases the thickness of the braze layer 165, 166 (e.g., having thickness of $t_1$ and $t_2$) that may be pre-deposited onto the nanofoil 167. This figure also shows that more braze may melt on the Ti component than on the SiC component ($t_{Ti}>t_{SiC}$). This prediction may be attributed to the fact that SiC has a much higher thermal conductivity than Ti-6-4. Combined, the present results indicate it may be desirable to keep the thickness of braze 165, 166 pre-deposited onto the nanofoil 167 as small as possible. The results also indicate that, for a nanofoil 167 having a total thickness (which may or may not include the layers 165, 166) of about 180 μm having Incusil layers 165, 166 with a thickness of about 1 μm pre-deposited on both sides of the nanofoil 167, substantial melting of the braze layers 161, 163 deposited onto both components 162, 164 may occur. Thus, this configuration provides a suitable design for the joining process. Based on these results, it should be obvious for one skilled in the art to design the thickness of fusible material pre-deposited on the reactive nanofoil, both to design the joining process as well as to achieve other effects such as limiting the thermal exposure of the components.

Figure 19:
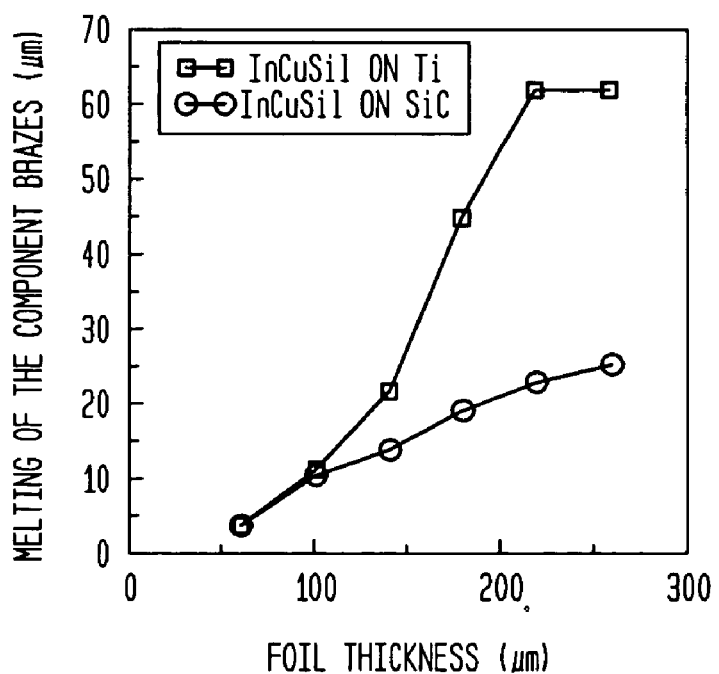
FIG. 19 depicts exemplary graphical results for the reactive multilayer joining configuration of FIG. 16.

The asymmetric arrangement of FIG. 16 may also be used to examine the effect of overall nanofoil thickness, $t_F$, on $t_{Ti}$ (the thickness of the molten braze layer 161 on the titanium 162) and $t_{SiC}$ (the thickness of the molten braze layer 163 on the silicone carbide 164). In light of the results above, the thicknesses $t_1$ (the thickness of the braze layer 165 on the SiC side of the nanofoil 167) and $t_2$ (the thickness of the braze layer 166 on the Ti-side of the nanofoil 167) may be held fixed, $t_1=t_2$, where, for example, both $t_1$ and $t_2$ may be equal to about 1 μm. As shown in FIG. 19, the nanofoil thickness $t_F$ was varied between about 60 μm and about 270 μm, and the computed values of $t_{Ti}$ and $t_{SiC}$ are plotted against $t_F$. The results show that each of $t_{Ti}$ and $t_{SiC}$ may increase as the nanofoil thickness $t_F$ increases. For nanofoil thicknesses $t_F$ smaller than about 160 μm, the amount of melting of the braze layers 161, 163 that are pre-deposited onto the components 162, 164 may be quite small, as $t_{Ti}$ and $t_{SiC}$ may both fall below about 16 μm. On the other hand, for a nanofoil thickness $t_F$ larger than about 200 μm, the entire layer of Incusil 161 pre-deposited onto the Ti 163 may melt. The present results thus indicate that, for the configuration of FIG. 16, a suitable and/or desirable nanofoil thickness to achieve the suitable and/or desired effects may be in the range of about 150 μm to about 200 μm. A nanofoil thickness between about 150 μm and about 200 μm may be suitable and/or desirable because such a nanofoil thickness may ensure sufficient wetting of critical interfaces 168, 169 and/or avoid complete melting of the braze layers 161, 163 that are pre-deposited onto the components 162, 164. Using this methodology, it should be obvious for someone skilled in the art how to design the nanofoil thickness, particularly so as to induce melting at critical interfaces 168, 169, while avoiding this effect at initially bonded interfaces.

The asymmetric arrangement of FIG. 16 may also be used to examine the effect of heat of reaction on the melting of the fusible material 161, 163, 165, 166 and on wetting at critical interfaces 168, 169. As mentioned herein, the heat of reaction of reactive multilayer nanofoils 167 may be controlled using a variety of means, for example, by varying one or more of the stoichiometry, the deposition rate (which affects the premix width), and/or the bilayer thickness, and/or by annealing the nanofoil at moderate temperature in an inert environment, as discussed in Gavens and Glocker.

Figure 20:
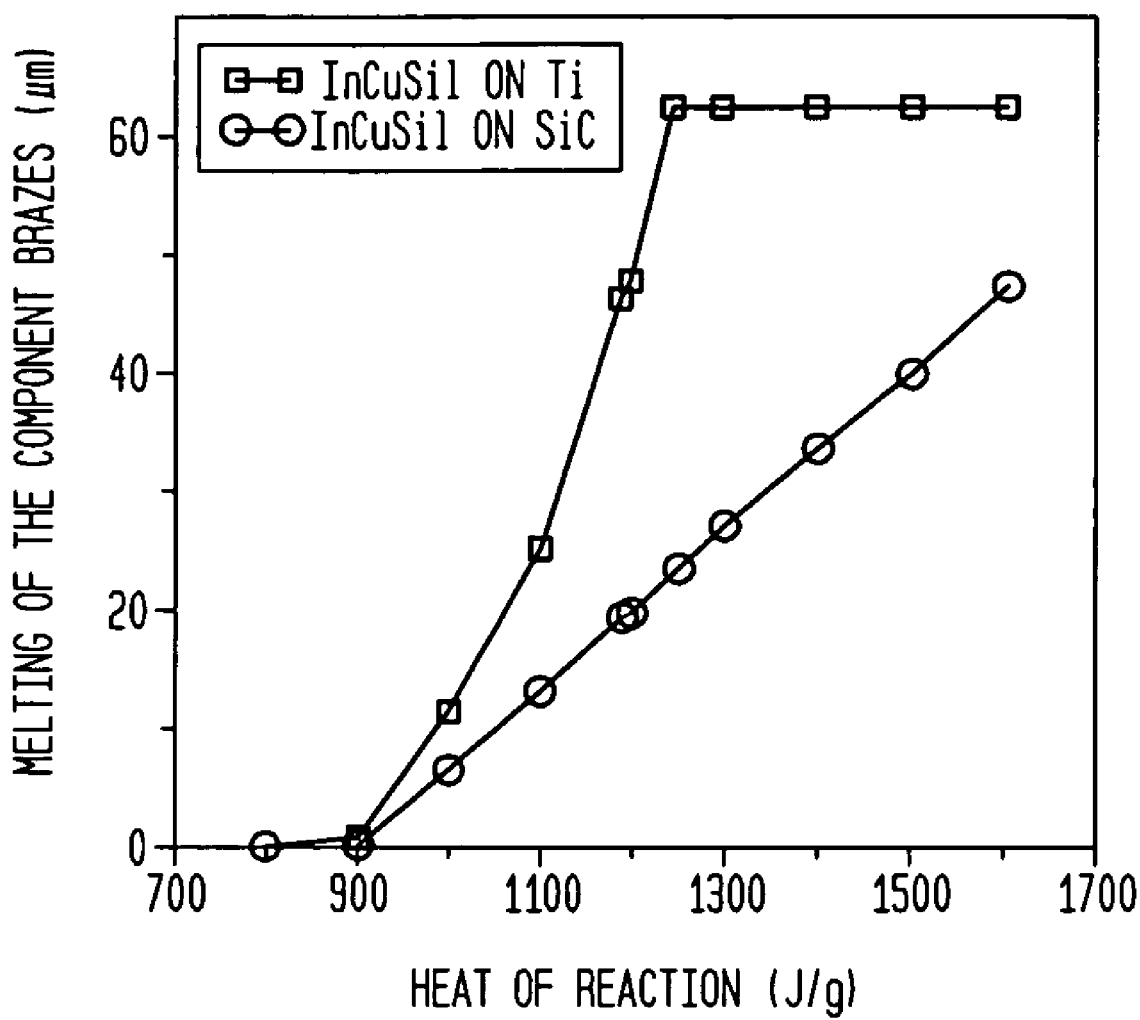
FIG. 20 depicts exemplary graphical results for the reactive multilayer joining configuration of FIG. 16.

To illustrate the impact that varying the heat of reaction may have on melting fusible materials 161, 163, 165, 166 and/or wetting critical interfaces 168, 169, computed simulations were conducted with a nanofoil 167 having a fixed thickness $t_F$ of about 180 μm, and Incusil layers 165, 166, that were pre-deposited on the nanofoil 167, each having a fixed thickness $t_1$ and $t_2$ of about 1 μm. The front velocity was held fixed at about 2.9 m/s. With these fixed values, the heat of reaction was varied in the range between about 800 J/g and about 1600 J/g. Using these inputs, predicted values for $t_{Ti}$ and $t_{SiC}$ were computed from the simulations and are plotted against the heat of reaction, as shown in FIG. 20. The results indicate that $t_{Ti}$ and/or $t_{SiC}$ may exhibit a strong dependence and/or correlation with the heat of reaction. For example, as shown in FIG. 20, when the heat of reaction drops below about 900 J/g, the results predict that insignificant melting of the braze layers 161, 163 may occur. As the heat of reaction is increased beyond about 900 J/g, the results predict that the curves for $t_{Ti}$ and/or $t_{SiC}$ may rise rapidly. In particular, when the heat of reaction exceeds about 1300 J/g, the results predict that substantially the entire layer of Incusil 161 pre-deposited onto the Ti 162 may melt during the reactive joining process. These results underscore the need and/or benefits of carefully controlling or characterizing the heat of reaction. For example, in the present asymmetric configuration set forth in FIG. 16, the heat of reaction used may preferably fall in the range of about 1160 J/g to about 1300 J/g. The heat of reaction can be controlled in a known manner so as to control the amount of melting of the braze material, to thereby limit the thermal exposure of the components, and/or to control other related results and/or effects.

Figure 21:
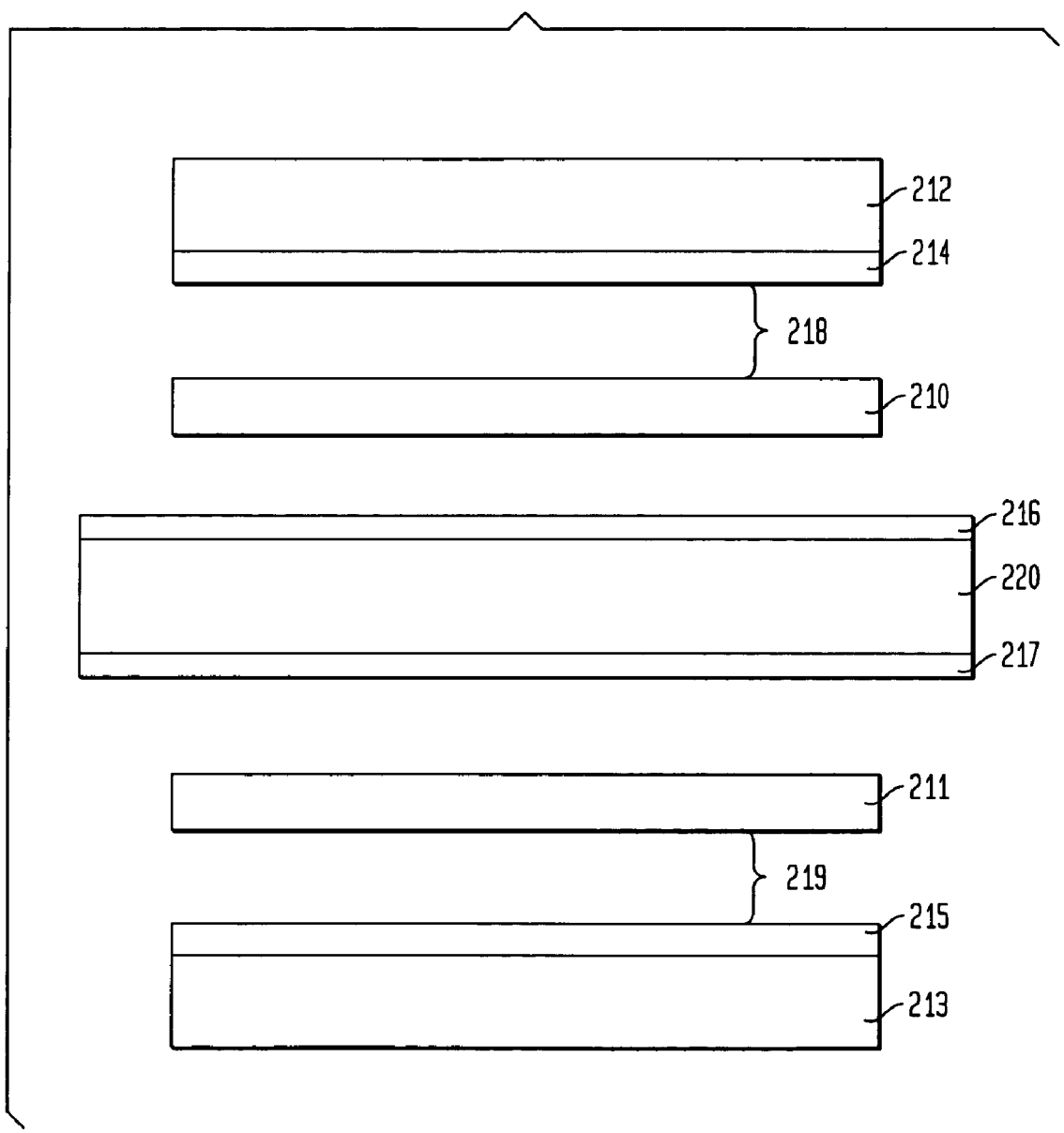
FIG. 21 depicts a schematic view of a reactive multilayer joining configuration.

In another embodiment of this invention, one or more free-standing sheets 210, 211 of one or more fusible materials 210, 211 may be used in an asymmetric configuration. For example, FIG. 21 illustrates an alternative configuration for joining of SiC 212 and Ti 213. As illustrated in FIG. 21, the alternative configuration uses free-standing sheets 210, 211 of Au—Sn solder 210, 211 as the fusible material. The sheets 210, 211 may each have a thickness of about 25 μm. The SiC 212 and Ti 213 may be treated in substantially the same fashion as any of the configurations set forth herein. For example, an Incusil layer 215 having a thickness of about 62 .mu. m may be pre-deposited onto the Ti 213 and/or an Incusil layer 214 having a thickness of about 100 μm may be pre-deposited onto the SiC 212. The reactive nanofoils 220 may have Incusil layers 216, 217 pre-deposited on either side. The Incusil layers 216, 217 pre-deposited on the reactive nanofoils may have a thickness of about 1 μm.

In the configuration shown in FIG. 21, the nanofoil may preferably deliver sufficient amounts of heat to completely melt the free-standing Au—Sn layers 210, 211. However, melting of one or more of the Incusil braze layers 214, 215, 216, 217 may not be necessary, as each Au—Sn solder layer 210, 211 may adhere sufficiently to its respective Incusil braze layers 214, 215, 216, 217 regardless of whether the braze itself melts. As discussed below, a parametric study was conducted to determine the effect that the thickness of the nanofoil has on the melting of the solder layers 210, 211 and/or the melting of the one or more Incusil braze layers 214, 215 that are pre-deposited onto the Ti 213 and SiC 212. The thickness of the reactive nanofoil layer 220 was varied between about 30 µm and about 270 µm.

Figure 22:
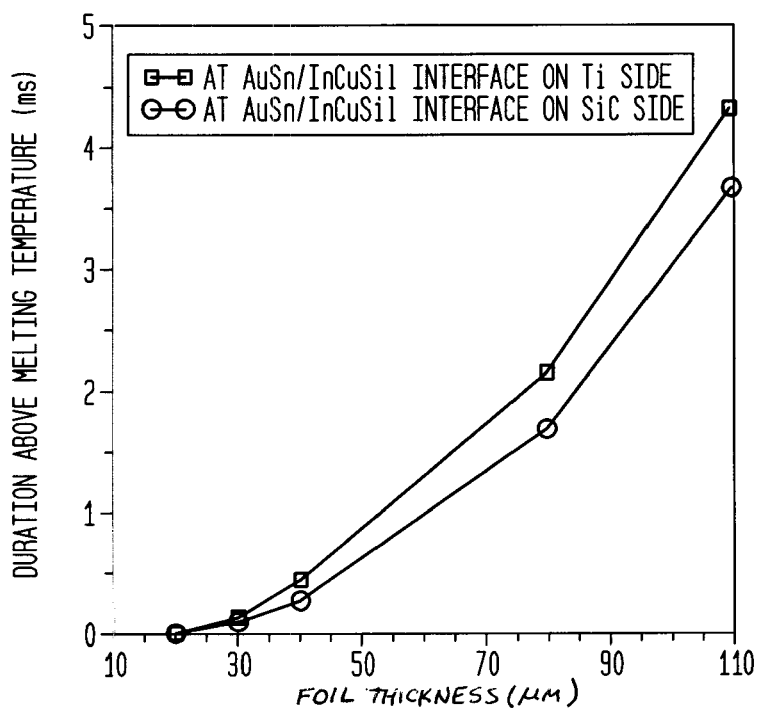
FIG. 22 depicts exemplary graphical predictions for the reactive multilayer joining configuration of FIG. 21.

Since the present configuration may require substantially complete melting of the Au—Sn solder 210, 211, the predictive analysis was conducted by monitoring the solder temperature at the interface 218, 219 of each Au—Sn solder layer 210, 211 and its respective Incusil braze layers 214, 215 which are pre-deposited on the component Ti 213 and/or SiC 212. For each of the configurations (e.g., where the thickness of the reactive nanofoil layer 220 was varied), time intervals were recorded during which the solder layers 210, 211 remained above its melting temperature at each of interfaces 218, 219. The predicted results are shown in FIG. 22, where the time interval during which solder layers 210, 211 remained above its melting temperature at each of the interfaces 218, 219 is plotted against the nanofoil thickness. The predicted results reveal that a minimal nanofoil thickness of about 30 µm may be necessary in order to melt both Au—Sn solder layers 210, 211 (e.g., the Au—Sn solder layer on the Ti side and/or the SiC side). For nanofoils 220 having a thickness of less than about 30 µm, the model predicts that there may be only partial melting of one or more Au—Sn solder layers 210, 211, and therefore a lack of bonding between one or more of the Au—Sn solder layers 210, 211 and the one or more Incusil brare layers 214, 215.

The strength of reactively formed joints using Au—Sn solder was determined experimentally, examples of which are set forth herein, and the shear strength measurements were compared with computational predictions. The analyses set forth below reveal that the joint strength may initially increase as the duration of the melting of the Au—Sn solder increases, and that peak strengths of the joints may be obtained when the Au—Sn solder at the critical interfaces is above its melting temperature for a time duration exceeding about 0.5 ms. Based on this work, a nanofoil thickness of about 70 µm may be needed to achieve an adequate joint strength. The computations were also used, examples of which are set forth herein, to examine possible melting of Incusil which is pre-deposited onto the components. The results indicate that when the nanofoil thickness is smaller than about 200 µm, the braze layers pre-deposited onto the Ti and SiC may remain below the Incusil's melting temperature. For thicker nanofoils, partial melting of the Incusil in one or both of these layers 214, 215 may occur.

In another embodiment of this invention, the effect of the melting duration of the solder or braze on the strength of the resulting reactive joints has been analyzed experimentally. The experimental investigation has been applied to configurations having different lengths and widths for one or more of the foil, solder layers, and components, but with fixed thicknesses for one or more of the foil, the solder layers, and of the components. Specifically, reactive joints between SiC and Ti-6-4 have been formed using Incusil (braze) as the fusible material, and using AgSnSb (solder) as the fusible material. Both small-area (0.5 in.×0.5 in.) and large-area (4 in. ×4 in.) have been considered, and the strength of the resulting joints experimentally determined. In both case, a 90 µm reactive foil was used. The measured strength of the joints is shown in the table below as function of the joint area:

| | Fusible Material | |
| Area | Incusil (braze) | AgSnSb (solder) |
| --- | --- | --- |
| 0.5 in × 0.5 in | 59.5 MPa | 67.5 MPa |
| 4 in × 4 in | 0 MPa | 66.9 MPa |

For the present conditions, the model predictions indicate that, irrespective of the joint area, the melting duration of the braze is about 0.28 ms, while for the solder the melting duration is about 5.49 ms. The larger melting duration of the solder is in fact expected, since the latter has much lower melting temperature. Comparison of the prediction of melting duration with measured shear strength reveals that the larger the length and the width of the configuration (i.e. the joining area), the larger the melting duration needed to achieve adequate strength of the reactive joint. This is evidenced by the fact that with Incusil as the fusible material, the melting duration was short, and strong bonds were obtained for the small-area joint but the joints failed when the same protocol was applied to a large-area joint. On the other hand, when AgSnSb as the solder material, the melting duration was larger and similar strengths were obtained for both small-area and large-area joints. It should be evident for one skilled in the art to generalize these findings to other material systems and joint areas.

Figure 23:
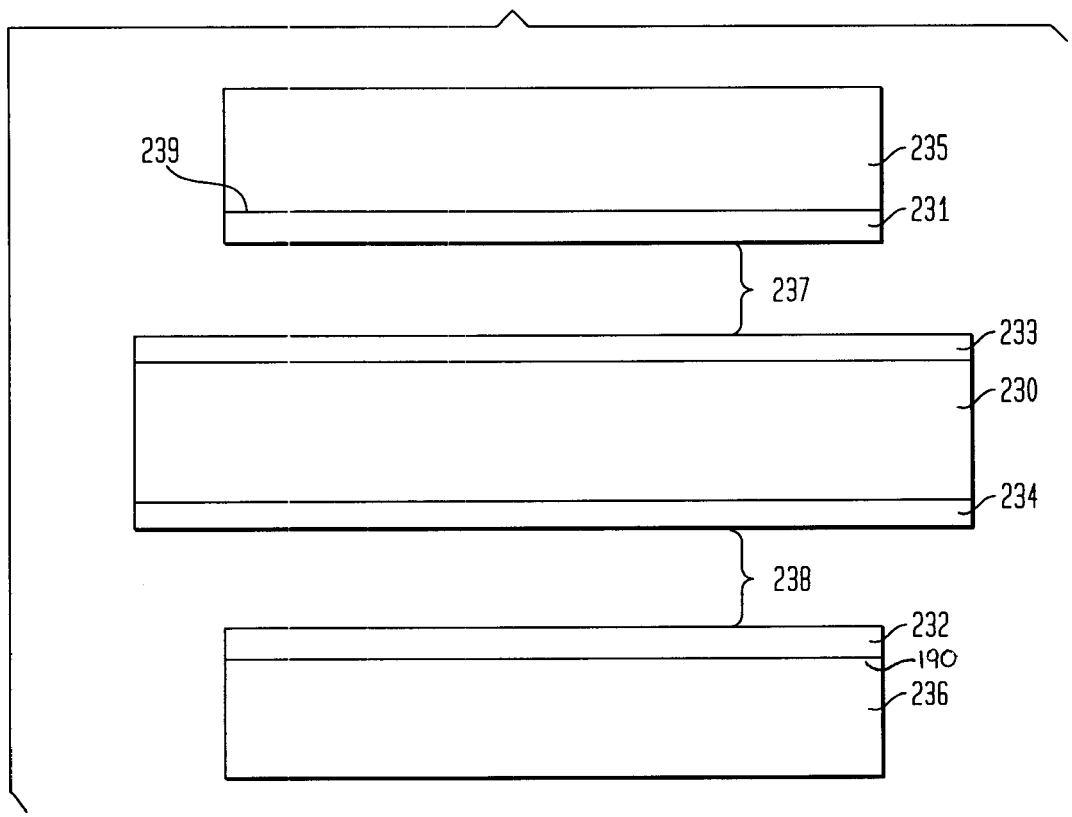
FIG. 23 depicts a schematic view of a reactive multilayer joining configuration.

In another embodiment of this invention, another asymmetric configuration corresponding to reactive joining of Al-6101-T6 to $Al_2O_3$ is considered in FIG. 23. In particular, the configuration in FIG. 23 may be used to analyze the effect of the thickness of the foil 230 on the wetting of the critical interface between the foil 230 and the solder 231, 232, namely by quantifying the time duration during which the solder 231, 232 is locally in a molten state. To this end, the thickness of the foil 230 may be systematically varied, while the remaining parameters may be held fixed.

The model inputs include the thermophysical properties of the foil 230, the joining layers, 231, 232, 233, 234, and of the components 235, 236, as set forth in the following table and FIG. 13.

| Material | Thermal Conductivity (W/m/K) | Heat Capacity (J/kg/K) | Density (kg/m$^3$) |
| --- | --- | --- | --- |
| Al-6101-T6 | 218 | 895 | 2700 |
| Ag—Sn | 33 | 227 | 7360 |
| Incusil-ABA | 70 | 276 | 9700 |
| Al—NiV Foil | 152 | 830 | 5665 |
| $Al_2O_3$ | 30 | 88 | 3900 |

Other possible inputs may include the solidus temperature in Incusil ($T_s$=878K), the liquidus temperature of Incusil ($T_f$=988K), the heat of fusion of Incusil ($H_f$=10,792 J/mol), the solidus temperature of Ag—Sn solder ($T_s$=494K), the liquidus temperature of the Ag—Sn solder ($T_f$=494K), and the heat of fusion of Ag—Sn solder ($H_f$=14200 J/mol).

In the configuration shown in FIG. 23, the solder layer 231 on the $Al_2O_3$ component 235 may have a thickness of about 100 µm, while the solder layer 232 on the Al-6101-T6 component 236 may have a thickness of about 75 µm. The reactive multilayer foil 230 may have about 1 µm thick layers 233, 234 of Incusil deposited on both sides of the foil 230.

Figure 24:
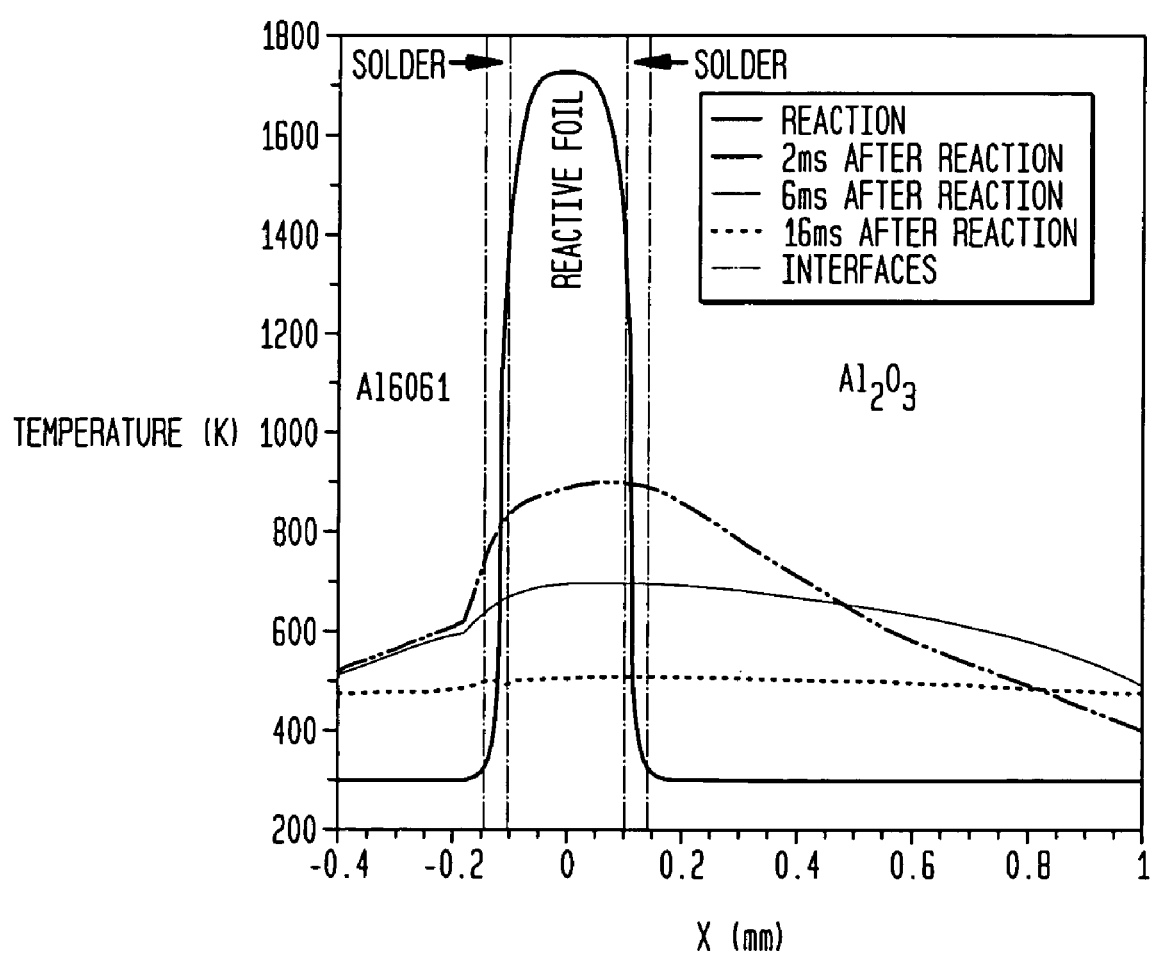
FIG. 24 depicts exemplary predicted temperature profiles of the reactive multilayer joining configuration of FIG. 23.

Details of the temperature distribution during the reactive joining process are shown in FIG. 24, which depicts instantaneous profiles across the joint due to the chemical transformation of a foil 230 having a thickness of about 148 μm at different times. As seen in FIG. 24, thermal transport may occur in an asymmetric fashion on either side of the foil 230, and that the thermal gradients in solder layers 231, 232 may be weaker on the side with the Al₂O₃ component 235 than on the side with the Al-6101-T6 component 236. These phenomena may be directly traced to the disparity between the components' 235, 236 thermal diffusivity, which may be much higher for the Al-6101-T6 component 236 than for the Al₂O₃ component 235.

Figure 25A:
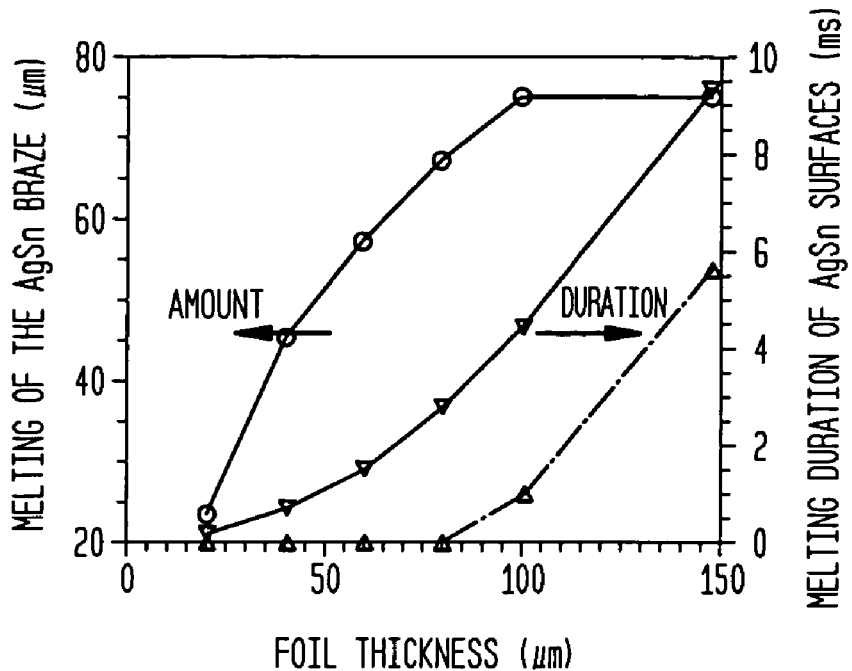
FIG. 25(a) depicts exemplary predicted results of the reactive multilayer joining configuration of FIG. 23.
Figure 25B:
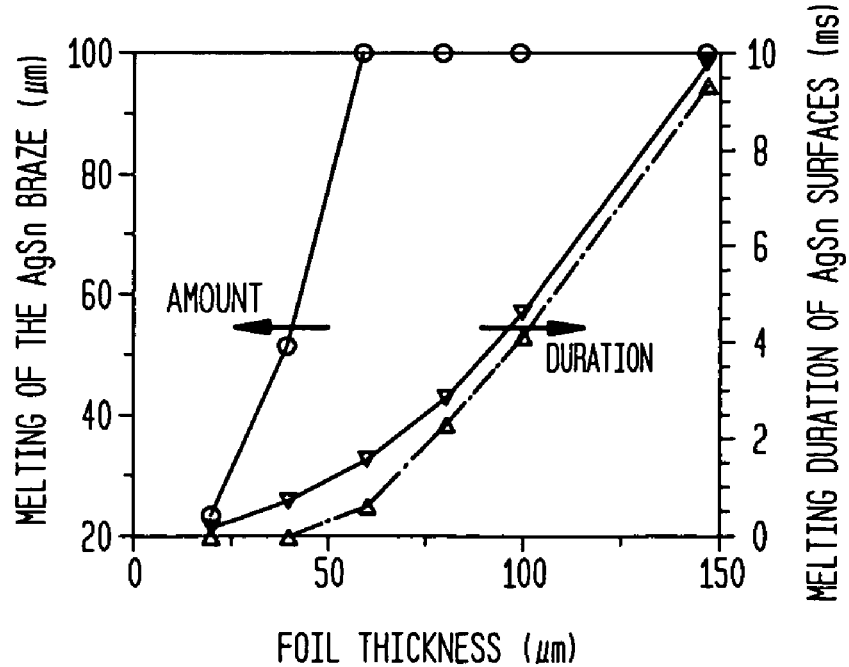
FIG. 25(b) depicts exemplary predicted results of the reactive multilayer joining configuration of FIG. 23.

The effect of the thickness of the foil 230 is analyzed in FIGS. 25(a) and 25(b). FIG. 25(a) shows the amount of melting of the solder layers 231, 232 and FIG. 25(b) illustrates the duration of melting at the critical foil-solder interfaces 237, 238 and at the solder-component interfaces 239, 190. The predictions indicate that joining may occur for all the foil thicknesses considered, which range between about 20 μm and about 148 μm. Note that when the thickness of the foil 230 is less than about 60 μm, partial melting may occur in both solder layers 231, 232. For foil thicknesses between about 60 μm and about 100 μm, complete melting may occur of the solder layer 231 lying on the side of the Al₂O₃ component 235, while the solder layer 232 on the side of the Al-6101-T6 component 236 may partially melt. For foil 230 having a thickness larger than about 100 μm, both solder layers 231, 232 may completely melt. In the latter regime, the results indicate that the local melting duration of the solder layers 231, 232 may increase substantially linearly with increasing thickness of the foil 230. Consistent with the results in FIG. 24, FIGS. 25a and 25b also indicate that there may be more complete and uniform melting on the side of the Al₂O₃ component 235 than on the side of the Al-6101-T6 component 236. In particular, the duration of melting at the solder-foil interface 237 on the Al₂O₃ side may be approximately equal to the duration of melting at the solder-component interface 239 also on Al₂O₃ side, as shown in FIG. 25b. On the other hand, these melting durations may differ substantially on the Al side, as shown in interfaces 238, 190 in FIG. 25a. Combined, the results in FIGS. 24, 25a, and 25b demonstrate that the thermal diffusivity of the solder and the components may be critical to duration and uniformity of the melting, and hence to joint strength. Consequently, the design of reactive joining applications should carefully account for these parameters.

Figure 26:
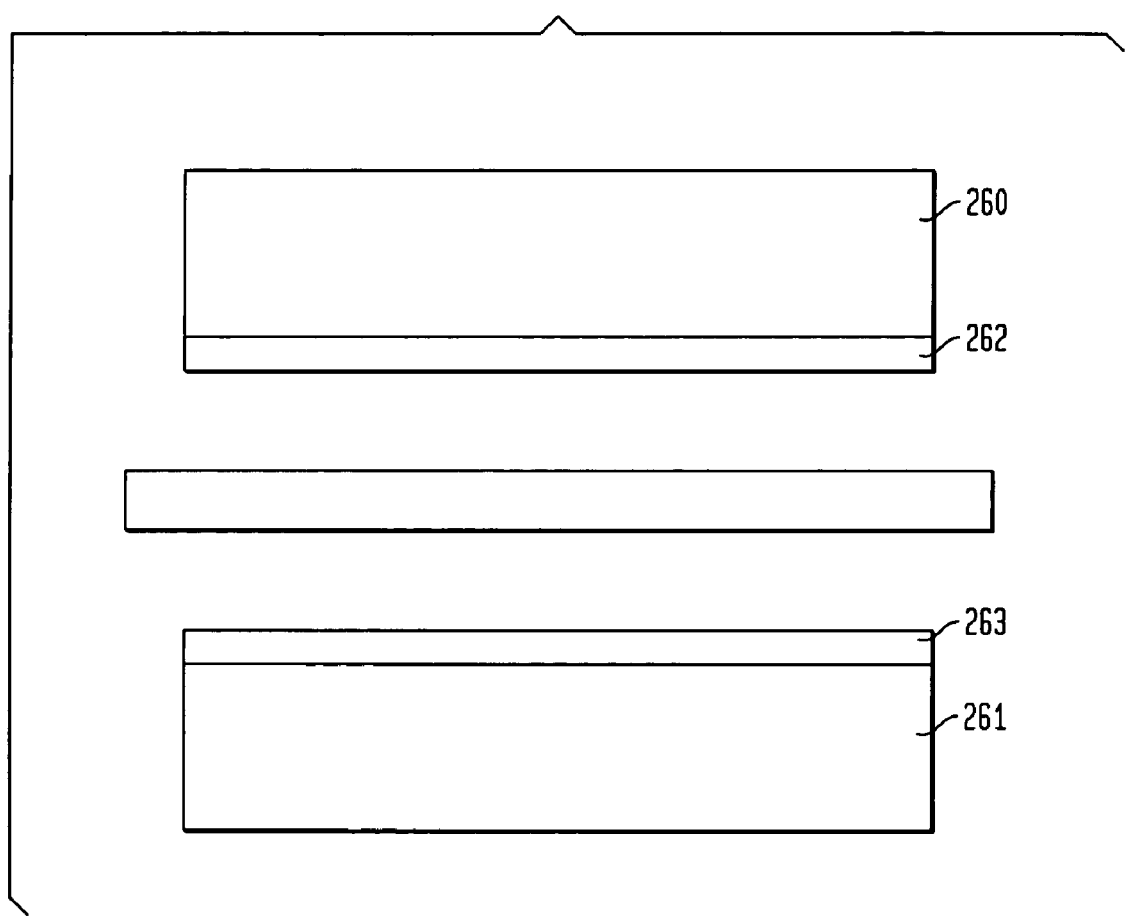
FIG. 26 depicts a schematic view of a reactive multilayer joining configuration.

In another embodiment of this invention, a reactive joining configuration may be used that involves multiple fusible-material layers that are chemically distinct. One particular configuration is set forth in FIG. 26. FIG. 26 shows an asymmetric configuration in which two fusible materials 262, 263 are employed, where the fusible material 262 with higher melting temperature T1 may be used on the side with the component 260 having a lower thermal conductivity k1, while the fusible material 263 with lower melting temperature may be used on the side with the more conductive component 261 having a higher relative thermal conductivity k2. Examples of such arrangement include the joining of SiC and Ti, where a lower melting temperature braze such as Incusil is pre-deposited onto the more conductive SiC, while a higher melting temperature braze such as Gapasil or TiCuNi is used on the less conductive Ti component. Such arrangements offer the possibility of designing for thermal transport during the reaction, chemical compatibility between individual braze or solder layers for the adjoining components, as well as thermophysical properties of the reactive joint. It should be obvious for someone skilled in the art how to generalize the present embodiment to a variety of other configurations.

III. Optimizing Reactive Foil Joints

As shown in Part I, above, the mechanical properties of a brazed or soldered joint are enhanced by refining the microstructure of brazing or solder layer in the formed joint. Specifically it is desirable to reduce the lamellar spacing from the micrometer range commonly produced by furnace or torch heating to the nanometer range (less than about 100 nm), preferably less than about 50 nm and even more preferably less than about 10 nm. As further noted in Part I, the lamellar spacing λ is related to the cooling rate Rc by the relation.

$$\lambda = K/R_c^{1/2}$$

The thermal modeling technique described and illustrated in Part II can be used to model the heat flow in the reactive foil formation of a joint and thereby provide the cooling rate $R_c$. The thermal modeling technique computes the temperature at each cell center and time step. The cooling/heating rate at each cell center and time step can be computed by deriving the temporal rate of change of the predicted temperature (numerically deriving the first derivative of the temperature with respect to time). Thus for each combination of the relevant parameters, including foil thickness, foil heat of reaction, reaction instantaneous and average velocity, and applied pressure, the model provides a prediction of the cooling rate distribution throughout the entire solder/braze region and throughout the joining procedure (including when the solder/braze solidifier). The model can thus be used to determine which combination of the above parameters results in the desired cooling rate gradient and resulting lamellar spacing.

The lamellar spacing in a solder or braze material is dependant on the cooling rate during the formation of reactive joints, which varies with the geometries and properties of the foils and the components being joined. It is expected that a higher cooling rate will result in a finer microstructure for the solder or braze material that is being used.

Numerical predictions of heat transfer during the reactive joining process show that the cooling rate of the solder or braze material can be controlled by varying the geometries and properties of the foil, the solder or braze, and the component. For example, when joining thin components (1 mm) with very low thermal conductivity, such as Silicone, using a very thick reactive foils (1 mm) and low melting point solders (InSn), the cooling rate in the solder layer at the solidification temperature is estimated to be as low as 5° C./second. In contrast, when very thermal conductive components, such as diamond, are joined using a 60 μm thick reactive foils and Incusil braze layers instead of a low melting temperature solder, the cooling rate in the braze layer at the solidification temperature can be as high as $5 \times 10^{6 \circ}$ C./second. Relevant physical properties of the components, reactive foils and solder materials are listed in Table 1.

In general, there are several ways to increase the cooling rate in the solder or braze layer, thus to obtain refined microstructure of the solder or braze material, and to improve the performance of the reactive joints. For the geometries and properties of the components, higher thermal conductivity, lower density, lower heat capacity, and a larger thickness will result in a higher cooling rate in the solder or braze layer. For the reactive foils, using thinner foils will generate less heat and thus will increase the cooling rate across the joint. In addition, using foils with lower heat capacity, lower density and higher heat of reaction (J/g) will also increase the cooling rate in the solder or braze layer at its solidification temperature. For the solder or braze layer, using a solder or braze with higher melting point, higher thermal conductivity, lower heat capacity and lower density will generally yield a higher cooling rate.

TABLE 1

Physical properties of components and solder or braze materials. Relevant parameters also include the solidus and liquidus temperatures of Incusil, respectively $T_s$ = 878 K and $T_l$ = 988 K, the Incusil heat of fusion $H_f$ = 10792 J/mol, the solidus and liquidus temperatures of the InSn solder, respectively $T_s$ = $T_l$ = 391 K and the InSn heat of fusion $H_f$ = 5200 J/mol.

| | Density (g/cm$^3$) | Thermal conductivity (W/mK) | Heat capacity (J/kgK) |
|---|---|---|---|
| Silicone | 1.35 | 0.23 | 2100 |
| Diamond | 3.51 | 3050 | 520 |
| InSn solder | 7.3 | 34 | 270 |
| Incusil braze | 9.7 | 70 | 276 |

It is understood that the above-described embodiments are illustrative of only a few of the many possible specific embodiments, which can represent applications of the invention. Numerous and varied other arrangements can be made by those skilled in the art without departing from the spirit and scope of the invention.

The invention claimed is:

1. A joined structure comprising a first body and a second body joined to the first body by a region comprising remnants of a reactive multilayer foil and a solder or braze, wherein the solder or braze forms an eutectic alloy microstructure having a lamellar spacing of less than 100 nanometers, and wherein the combination of the bodies, the foil and the solder or braze is selected to produce a cooling rate in the solder or braze of greater than 1000° C./s after the reaction of the multilayer foil.

2. A joined structure comprising a first body and a second body joined to the first body by a region comprising remnants of a reactive multilayer foil and a solder or braze, wherein the solder or braze forms an eutectic alloy microstructure having a lamellar spacing of less than 50 nanometers, and wherein the combination of the bodies, the foil and the solder or braze is selected to produce a cooling rate in the solder or braze of greater than 1000° C./s after the reaction of the multilayer foil.

3. A joined structure comprising a first body and a second body joined to the first body by a region comprising remnants of a reactive multilayer foil and a solder or braze, wherein the solder or braze forms an eutectic alloy microstructure having a lamellar spacing of less than 10 nanometers, and wherein the combination of the bodies, the foil and the solder or braze is selected to produce a cooling rate in the solder or braze of greater than 1000° C./s after the reaction of the multilayer foil.

* * * * *